United States Patent
Melman et al.

(10) Patent No.: US 10,177,287 B1
(45) Date of Patent: Jan. 8, 2019

(54) GAMUT BROADENED DISPLAYS WITH NARROW BAND GREEN PHOSPHORS

(71) Applicant: EIE MATERIALS, INC., Lexington, KY (US)

(72) Inventors: Jonathan Melman, Lexington, KY (US); Robert Nordsell, Lexington, KY (US); Kristen Baroudi, Lexington, KY (US); Yong Bok Go, Lexington, KY (US); Eric Bretschneider, Corinth, TX (US); Alan C. Thomas, Yardley, PA (US); Evan Thomas, Lexington, KY (US)

(73) Assignee: EIE MATERIALS, INC., Lexington, KY (US)

( * ) Notice: Subject to any disclaimer, the term of this patent is extended or adjusted under 35 U.S.C. 154(b) by 0 days.

(21) Appl. No.: 15/982,193

(22) Filed: May 17, 2018

Related U.S. Application Data

(60) Provisional application No. 62/560,539, filed on Sep. 19, 2017, provisional application No. 62/649,374, filed on Mar. 28, 2018.

(51) Int. Cl.
 *H01L 33/50* (2010.01)
 *H01S 5/00* (2006.01)
 (Continued)

(52) U.S. Cl.
 CPC ........ *H01L 33/504* (2013.01); *C09K 11/0838* (2013.01); *C09K 11/56* (2013.01);
 (Continued)

(58) Field of Classification Search
 CPC ..... H01L 33/50; H01L 33/504; H01L 33/507; H01L 33/508; H01L 33/54; H01L 33/60; H01L 33/62
 See application file for complete search history.

(56) References Cited

U.S. PATENT DOCUMENTS

| 3,639,254 A | 2/1972 | Peters |
| 3,801,702 A | 4/1974 | Donohue |
| (Continued) | | |

OTHER PUBLICATIONS

Ruijin Yu et al., "Luminescence properties of stoichionmetric EuM2S4 (M=Ga, Al) conversion phosphors for white LED applications", Phys. Status Solidi A, May 31, 2012, pp. 1-6, DOI 10.1002/pssa. 201228348, Wiley Online Library.

(Continued)

*Primary Examiner* — Cuong Q Nguyen
(74) *Attorney, Agent, or Firm* — Innovation Counsel LLP

(57) ABSTRACT

Phosphors emitting green light over a narrow wavelength range may be used to broaden the gamut of display devices. In one aspect, a light emitting device comprises a light emitting solid state device emitting blue or violet light, a first phosphor that absorbs blue or violet light emitted by the light emitting solid state device and in response emits green light in a spectral band having a peak at wavelength $\lambda_G$ and a height of one half its peak on a long wavelength edge of the band at wavelength $\lambda_{Ghalf}$, and a second phosphor that absorbs blue or violet light emitted by the light emitting solid state device and in response emits red light in a spectral band having a peak at wavelength $\lambda_R$ and a height of one half its peak on a short wavelength edge of the band at wavelength $\lambda_{Rhalf}$. The ratio $(\lambda_{Rhalf} - \lambda_{Ghalf})/(\lambda_R - \lambda_G)$ is greater than 0.70.

15 Claims, 25 Drawing Sheets

(51) Int. Cl.
*C09K 11/08* (2006.01)
*C09K 11/77* (2006.01)
*C09K 11/62* (2006.01)
*C09K 11/64* (2006.01)
*C09K 11/56* (2006.01)

(52) U.S. Cl.
CPC .............. *C09K 11/62* (2013.01); *C09K 11/64* (2013.01); *C09K 11/7728* (2013.01); *H01S 5/0078* (2013.01)

(56) References Cited

U.S. PATENT DOCUMENTS

| | | | |
|---|---|---|---|
| 4,441,046 | A | 4/1984 | James |
| 5,747,929 | A | 5/1998 | Kato et al. |
| 6,417,019 | B1 | 7/2002 | Mueller et al. |
| 6,597,108 | B2 | 7/2003 | Yano et al. |
| 6,614,173 | B2 | 9/2003 | Yano et al. |
| 6,627,251 | B2 | 9/2003 | Yano et al. |
| 6,773,629 | B2 | 8/2004 | Le Mercier et al. |
| 6,926,848 | B2 | 8/2005 | Le Mercier et al. |
| 7,005,198 | B2 | 2/2006 | Yano et al. |
| 7,018,565 | B2 | 3/2006 | Tian et al. |
| 7,125,501 | B2 | 10/2006 | Tian et al. |
| 7,368,179 | B2 | 5/2008 | Tian et al. |
| 7,427,366 | B2 | 9/2008 | Tian et al. |
| 7,453,195 | B2 | 11/2008 | Radkov |
| 7,497,973 | B2 | 3/2009 | Radkov et al. |
| 7,651,631 | B2 | 1/2010 | Igarashi et al. |
| 7,768,189 | B2 | 8/2010 | Radkov |
| 7,816,862 | B2 | 10/2010 | Noguchi et al. |
| 8,921,875 | B2 | 12/2014 | Letoquin et al. |
| 9,219,201 | B1 | 12/2015 | Todorov et al. |
| 9,243,777 | B2 | 1/2016 | Donofrio et al. |
| 9,496,464 | B2 | 11/2016 | Yao et al. |
| 9,530,944 | B2 | 12/2016 | Jacobson et al. |
| 9,607,821 | B2 | 3/2017 | Levin et al. |
| 2002/0155317 | A1 | 10/2002 | Yano et al. |
| 2003/0042845 | A1 | 3/2003 | Pires et al. |
| 2007/0284563 | A1 | 12/2007 | Lee et al. |
| 2008/0128735 | A1 | 6/2008 | Yoo et al. |
| 2008/0296533 | A1 | 12/2008 | Stiles et al. |
| 2011/0043101 | A1 | 2/2011 | Masuda et al. |
| 2013/0032289 | A1 | 2/2013 | Nedella et al. |
| 2013/0114242 | A1 | 5/2013 | Pickard et al. |
| 2013/0313516 | A1 | 11/2013 | David et al. |
| 2014/0021855 | A1 | 1/2014 | Kubota et al. |
| 2014/0077689 | A1 | 3/2014 | Thompson et al. |
| 2014/0307417 | A1 | 10/2014 | Yamakawa et al. |
| 2014/0321099 | A1 | 10/2014 | Kaide et al. |
| 2016/0009990 | A1 | 1/2016 | Yoo et al. |
| 2016/0104820 | A1* | 4/2016 | Lim ..................... H01L 33/504 257/98 |
| 2016/0223146 | A1 | 8/2016 | Vick et al. |
| 2016/0293808 | A1* | 10/2016 | Kim ..................... H01L 33/504 |
| 2017/0146856 | A1 | 5/2017 | Yokota |
| 2018/0033922 | A1* | 2/2018 | Iwakura ............... H01L 33/504 |
| 2018/0171220 | A1* | 6/2018 | Li .......................... H01L 33/50 |

OTHER PUBLICATIONS

K.T. Le Thi, et al., "Investigation of the MS-Al2S3 systems (M = Ca, Sr, Ba) and luminescence properties of europium-doped thioaluminates", Materials Science and Engineering, B14 (1992) pp. 393-397.

P.C. Donohue, et al., "The Synthesis and Photoluminescence of MiiM2iii(S,Se)4", J. Electrochem. Soc. 1974, vol. 121, Issue 1, pp. 137-142.

A.G. Paulusz, "Efficient Mn(IV) Emission in Fluorine Coordination", J. Electrochem. Soc.: Solid-State Science and Technology, Jul. 1973, pp. 942-947.

Zhang, et al., "Robust and Stable Narrow-Band Green Emitter: An Option for Advanced Wide-Color-Gamut Backlight Display", CM Chemistry of Materials, Chem. Mater. 2016, 28, pp. 8493-8497.

International Search Report, PCT/US2018/020914, dated May 17, 2018, 1 page.

International Search Report corresponding to PCT/US2018/050077, dated Nov. 26, 2018, 1 page.

\* cited by examiner

GAMUT BROADENED DISPLAYS WITH NARROW BAND GREEN PHOSPHORS

CROSS REFERENCE TO RELATED APPLICATIONS

This application claims benefit of priority to U.S. Provisional Patent Application No. 62/560,539 titled "Gamut Broadened Illumination with Narrow Band Green Phosphors" and filed Sep. 19, 2017 and to U.S. Provisional Patent Application No. 62/649,374 titled "Gamut Broadened Displays With Narrow Band Green Phosphors' and filed Mar. 28, 2018, both of which are incorporated herein by reference in their entirety.

This application is also related to U.S. patent application Ser. No. 15/591,629 titled "Phosphors With Narrow Green Emission" and filed May 10, 2017, and to U.S. patent application Ser. No. 15/679,021 titled "Phosphor-Converted White Light Emitting Diodes Having Narrow-Band Green Phosphors" and filed Aug. 16, 2017, both of which are incorporated herein by reference in their entirety.

This invention was made with federal government support from the National Science Foundation under award number 1534771. The federal government has certain rights in the invention. This invention was also made with an award from the Kentucky Cabinet for Economic Development, Office of Entrepreneurship, under Grant Agreement KSTC-184-512-17-247 with the Kentucky Science and Technology Corporation.

FIELD OF THE INVENTION

The invention relates generally to phosphors having narrow green emission and to display devices comprising such phosphors.

BACKGROUND

In display backlighting, it is desirable for the green light source to have a narrow emission wavelength so that the light from the green light source appears more saturated, widens the green vertex of the color gamut, and sustains fewer losses when passing through the green filter of a typical LCD filter system because the majority of its intensity is well aligned with the highest transmissivity of the filter.

SUMMARY

The current invention relates to illumination systems which emit light with certain aspects of the spectral power distribution (SPD) that can enhance the breadth of colors that can be rendered by a display backlight unit through a broadening of the color gamut, or enhance the appearance of certain products through the saturation of certain spectral regions in general lighting and lighting used to illuminate products.

DETAILED DESCRIPTION

The following detailed description should be read with reference to the drawings, which depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention. As used in this specification and the appended claims, the singular forms "a," "an," and "the" include plural referents unless the context clearly indicates otherwise.

New phosphor materials having a narrow band green emission disclosed herein, in U.S. patent application Ser. No. 15/591,629, and in U.S. patent application Ser. No. 15/679,021 have good applicability to displays. Display manufacturers design displays according to various specifications.

Figure 1A:
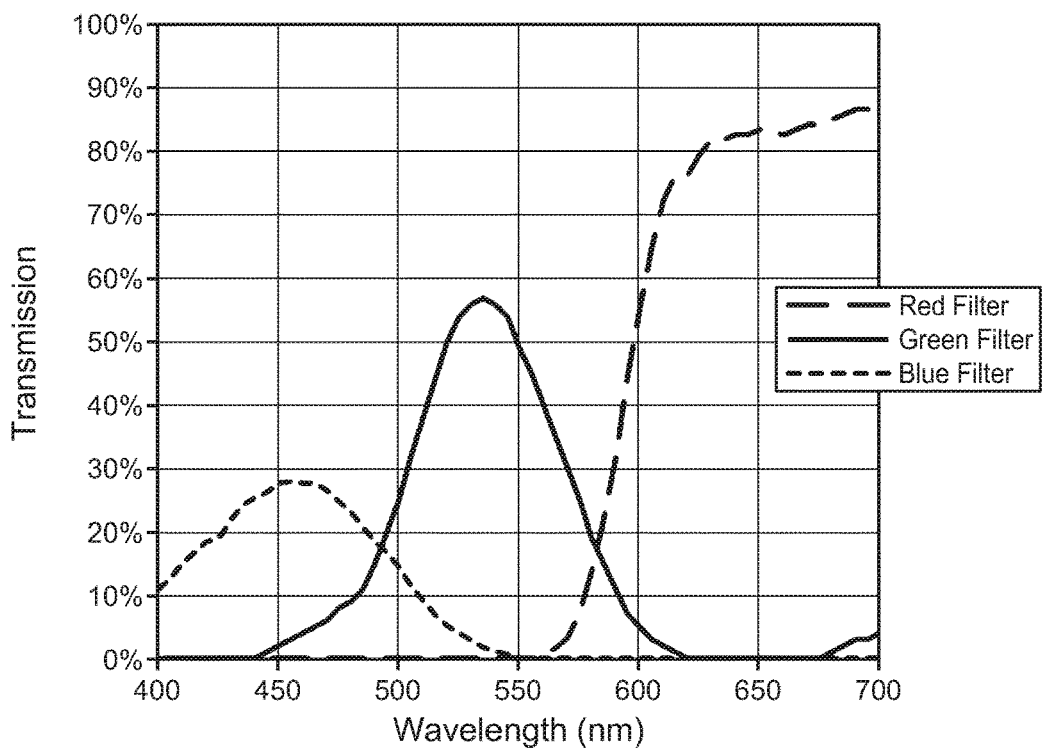
FIG. 1A shows typical transmission spectra for a color filter set for a backlit LCD display.
Figure 1B:
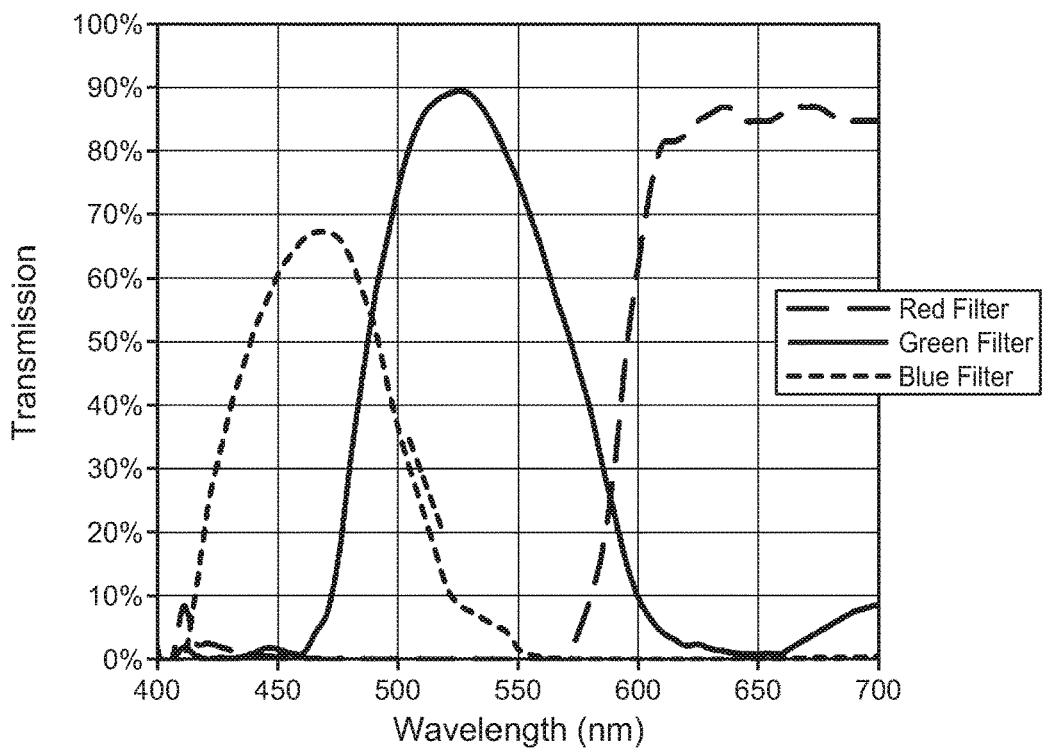
FIG. 1B shows typical transmission spectra for another color filter set for a backlit LCD display.

One of the most critical specifications is the color gamut or range of colors that can be produced by a display. For LCD based backlights this gamut is determined by the emission spectrum of the backlight and the transmission properties of the color filter set used to make the display. The transmission spectra of two typical color filter sets for backlit LCD displays are shown in FIG. 1A and FIG. 1B. Each filter set includes a red filter, a green filter, and a blue filter as indicated in the figures.

It can be seen from these figures that there is significant overlap between the different color filters. This complicates expanding the color gamut of a display since it requires developing light sources with relatively narrow spectral peaks. Note that the relative maximum transmissions of any particular color filter in the filter set can be adjusted relative to the others.

For the blue primary this overlap between color filters is not often significant since blue LEDs with narrow emission spectra are readily available, and the peak wavelength can be selected such that there is negligible bleed through of the blue LED into the transmission region of the green filter. There remains an issue though in that due to the overlap between the blue and green filter some light from the green light source may end up in the blue output. This desaturates the blue resulting in a reduced color gamut. Similarly the overlap between the red and green filters means that light from the red source may shift the chromaticity of the green primary and again reduce the color gamut. Once the light has been filtered into red, green, and blue components through the filter, it may be examined in the context of each sub-pixel being fully open, so that the white light is observed by the combination—this may be referred to as the through filter white.

Figure 2A:
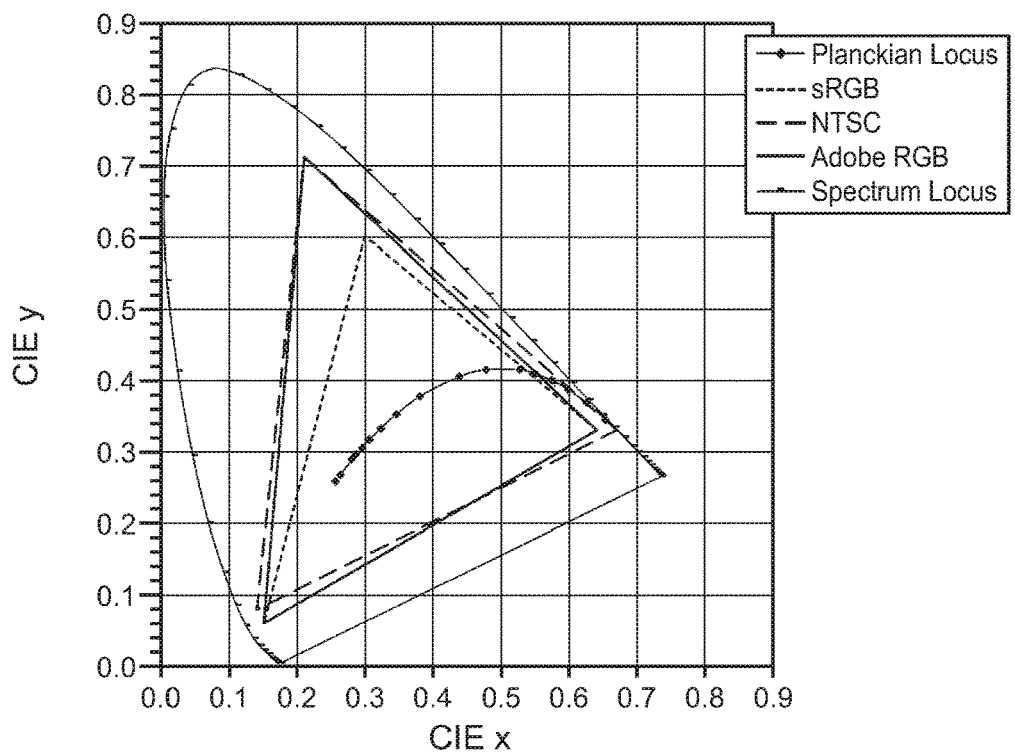
FIG. 2A shows a CIE 1931 x,y Chromaticity Diagram on which are plotted the sRGB, NTSC, and Adobe RGB color gamuts.
Figure 2B:
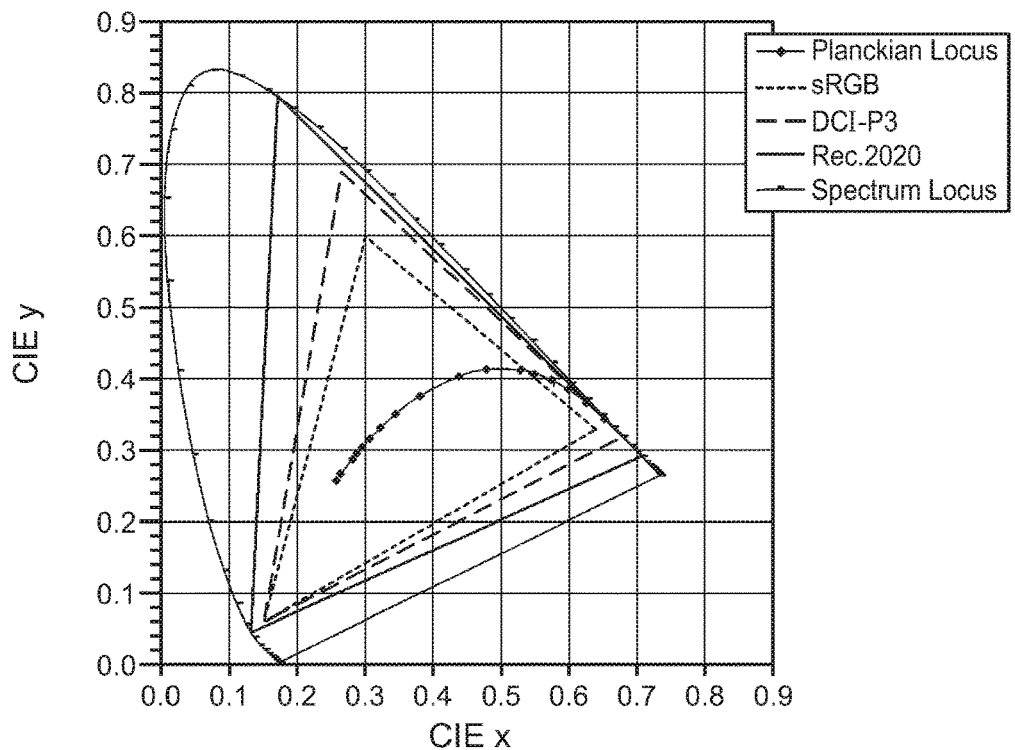
FIG. 2B shows a CIE 1931 x,y Chromaticity Diagram on which are plotted the sRGB, DCI-P3, and Rec. 2020 color gamuts.
Figure 3A:
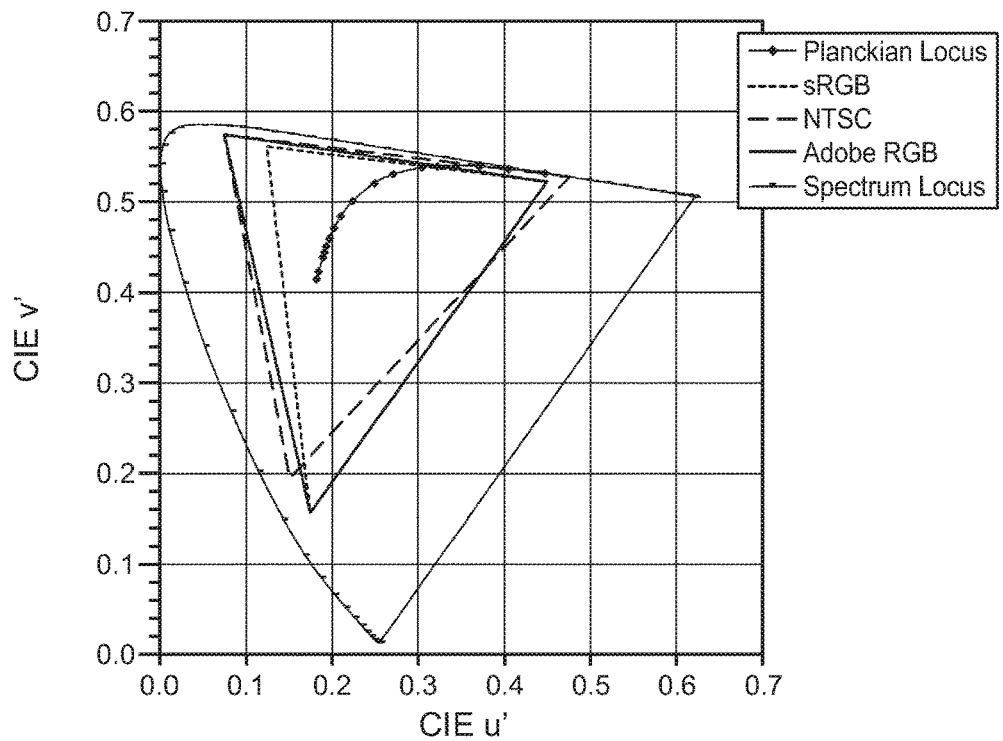
FIG. 3A shows a CIE 1976 u'v' Chromaticity Diagram on which are plotted the sRGB, NTSC, and Adobe RGB color gamuts.
Figure 3B:
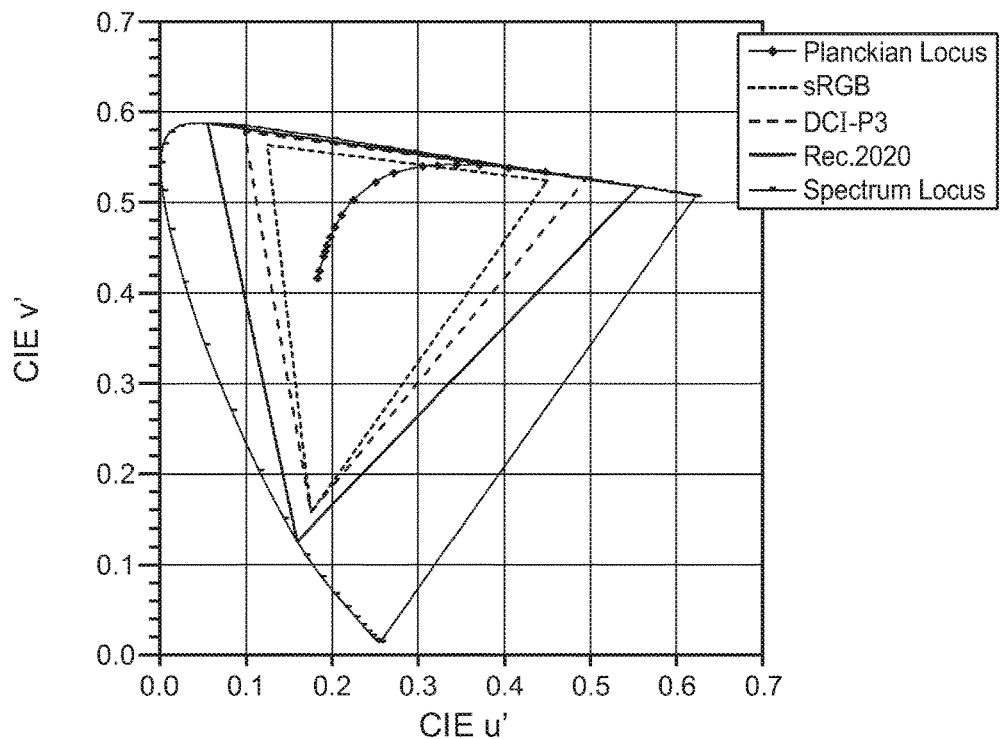
FIG. 3B shows a CIE 1976 u'v' Chromaticity Diagram on which are plotted the sRGB, DCI-P3, and Rec. 2020 color gamuts.

Various color gamuts have been defined by the industry and are used as target performance metrics. The smallest gamut and minimum requirement for most color displays is the so-called sRGB (or Rec. 709) gamut. A more desirable and larger color gamut is the Adobe RGB gamut. These gamuts are shown in FIGS. 2A and 3A below along with the NTSC color gamut developed for color CRT displays. More recently, other wider gamuts have been developed such as the DCI-P3 gamut which was developed for digital cinema and Rec. 2020 proposed for ultra high definition TV shown in FIGS. 2B and 3B. The more recent gamuts seem to be in part defined by the technologies available. For example the green gamut point of DCI-P3 is a strong match with the emission from beta-SiAlON phosphors, and the green gamut point of Rec. 2020 is a strong match with the emission from an Nd:YAG laser. Table 1 below shows CIE x,y gamut coordinates for red, green, and blue gamut vertices for the NTSC, sRGB, Adobe RGB, DCI-P3, and Rec. 2020 color gamuts.

When LED based backlights for color LCD displays were first introduced around 2006-2008, the minimum target for color gamut was the sRGB gamut. As can be seen in FIGS. 2A, 2B, 3A, and 3B, the sRGB gamut is the smallest color gamut illustrated. This was a difficult target to achieve due to the relatively broad emission bands of the green phosphors available at that time. Although they were able to eventually exceed sRGB color gamuts, display manufacturers were unable to achieve the desired, and much larger, Adobe RGB color gamut. The sRGB color gamut is only about 74% of the Adobe RGB color gamut when plotted on the CIE x,y chromaticity chart. A high quality display would have a color gamut that is at least 90% of the Adobe RGB color gamut area.

The newly developed green phosphors disclosed herein, in U.S. patent application Ser. No. 15/591,629, and in U.S. patent application Ser. No. 15/679,021, may have an extremely narrow emission band in the green. This is of great utility for LCD color displays and offers the ability to exceed the Adobe RGB color gamut area.

Figure 4:
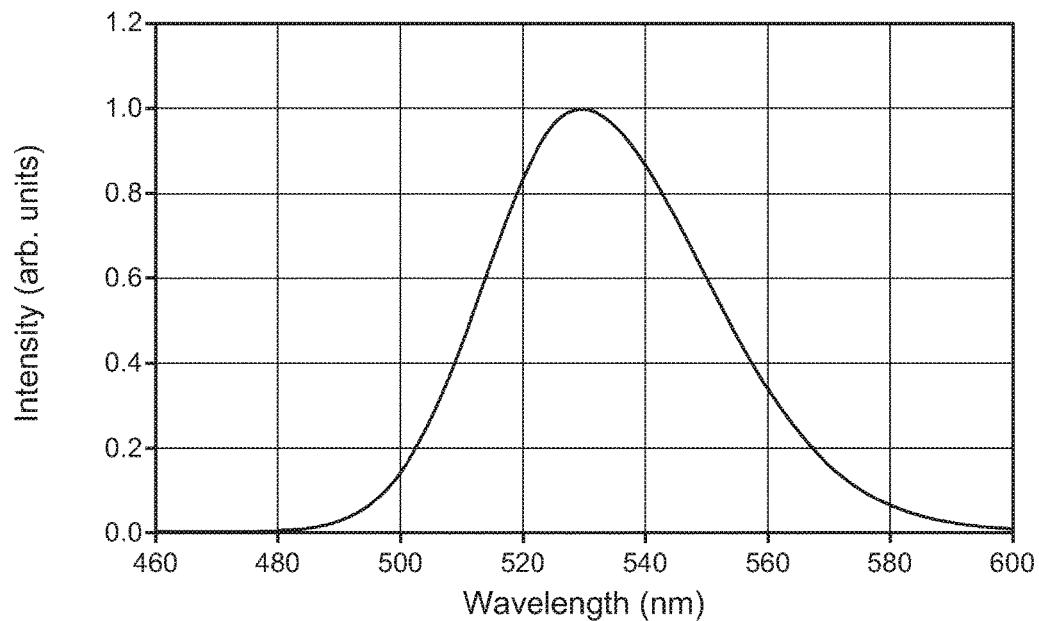
FIG. 4 shows a typical emission spectrum of a newly developed green phosphor material as described herein, for example $EuAl_{1.5}Ga_{1.2}S_{4.47}$.
Figure 5:
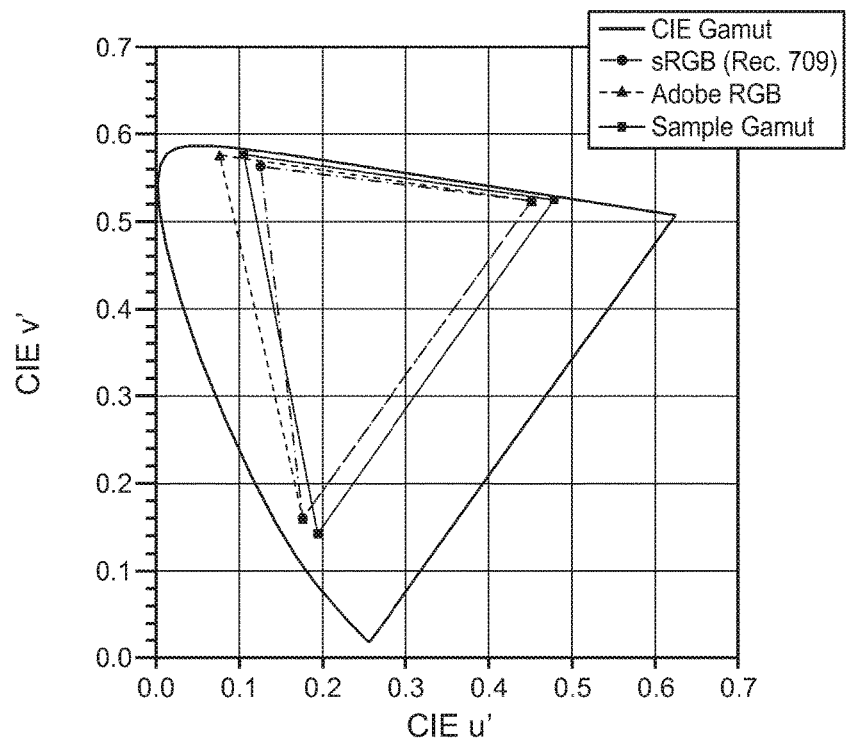
FIG. 5 shows a CIE 1976 u'v' Chromaticity Diagram on which are plotted a simulated color gamut for a backlit LCD display using the phosphor material of FIG. 4 and standard color filters. The sRGB and Adobe RGB gamuts are also plotted, for reference.

A typical emission spectrum from this type of material (the phosphor in example 3 described below and in Tables 2 and 3) is shown in FIG. 4. The relatively narrow emission band of this phosphor minimizes the overlap between the red and green color primaries of a backlit LCD display. This shifts the green primary away from the red primary and also increases the degree of saturation of the green primary. The combination of these two effects greatly increases the display gamut. FIG. 5 shows a simulated color gamut achievable using the newly developed green emitting phosphor material and standard color filters. The total gamut area from this simulation is >103% of the Adobe RGB color gamut. Minor modifications to the red filter would further reduce the overlap between the red and green filter spectra and could shift the green primary further to the left which would increase the display color gamut well beyond the Adobe RGB color gamut. Similar gamut expansion will also occur for variations of the phosphor with a narrower FWHM.

For general lighting applications, it is generally desirable to have the blue LED emit in generally longer wavelengths, for example between 455 nm and 465 nm. These wavelengths of blue typically result in a better color rendering index for white light sources compared to the same phosphors combined with a shorter wavelength blue LED, as well as a brighter white LED due to the blue emission being closer to the photopic maximum. For display backlighting, it is also true that a longer wavelength blue would result in a brighter sub-pixel, however, the impact of bleed through into, and subsequent desaturation of, the green sub-pixel outweighs the blue sub-pixel brightness. As a result, for display backlighting it is desirable to have a blue LED with peak wavelength around 445 nm to maximize gamut coverage while minimizing green sub-pixel desaturation, although it may also be desirable to have a blue LED with peak wavelength around 450 nm to provide higher brightness with a moderate trade off of gamut coverage.

The red phosphor may be a traditional broad band red, such as one of the $CaAlSiN_3:Eu^{2+}$ family (for example BR-102/Q or BR-101/J available from Mitsubishi Chemical) or $Sr_2Si_5N_8:Eu^{2+}$, or it may be a narrower red phosphor such as the recently reported $Sr[LiAl_3N_4]:Eu^{2+}$, or it could be narrow emitting quantum dots, or a manganese doped fluorosilicate family phosphor (such as PFS or KSF available from GE). Alternatively a direct emitting red LED, or some other source of red emission, may be used in place of a red phosphor. There are two primary spectral factors to consider when selecting red phosphors for the display: the amount of overlap with the transmission of the green filter and the brightness. Unlike with the green phosphor, the FWHM is not a consideration from the color saturation/purity perspective because of the proximity of the red region of the spectrum to the edge of the photopic response curve, i.e. the human eye doesn't perceive the emission particularly well, so the width of the emission, especially into the longer wavelengths, does not strongly impact color saturation of the red gamut point. FWHM of the red phosphor still must be considered from the perspective of bleed through into the green gamut point, and the surface brightness of the display.

A conventional backlight might utilize for example a europium doped beta-SiAlON type green phosphor, such as that sold by Denka, in combination with a PFS red phosphor, such as that sold or licensed by GE. The phosphors would be blended such that the color point of the LED emission spectrum seen through the color filters would meet a white light target requirement, such as CIE x,y (0.333, 0.333) or the D65 illuminant (0.313, 0.329) or another color point.

Comparative Green Phosphor Examples

Figure 6A:
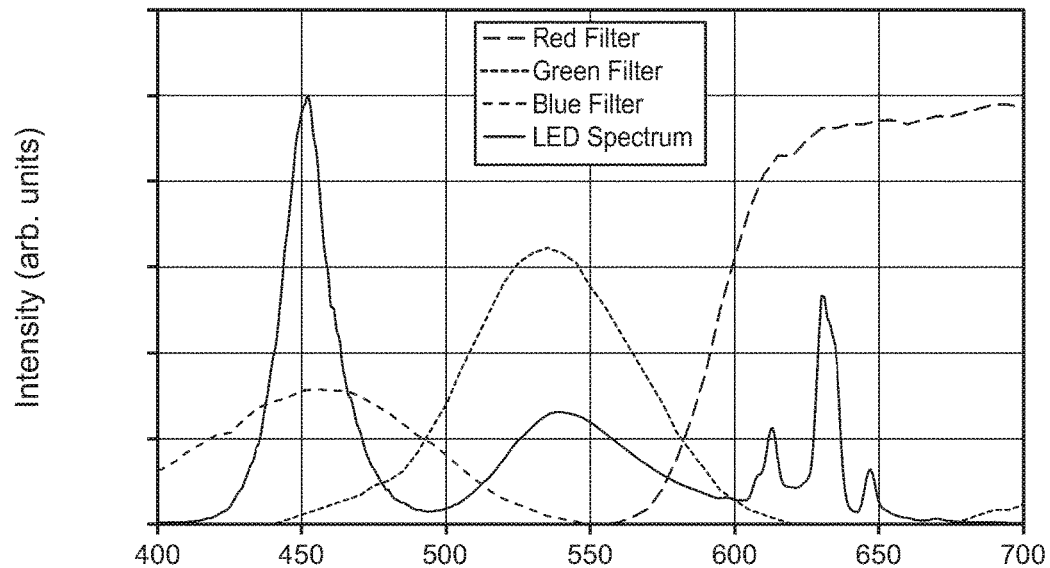
FIG. 6A shows the simulated emission spectrum from a conventional phosphor-converted white LED overlaid with the set of color filters from FIG. 1A.

As a comparative example of a conventional phosphor-converted white LED used in a back-lighting application, FIG. 6A shows the simulated emission spectrum (solid line) from a phosphor-converted LED using green phosphor beta-SiAlON with a peak wavelength of 543 nm and FWHM 54 nm, a red PFS phosphor, and a blue LED. The simulated emission spectrum has color coordinates CIE x,y (0.256, 0.228). In FIG. 6A the simulated emission spectrum is overlaid with the set of color filters from FIG. 1A (green filter, short dash; blue filter, medium dash; red filter, long dash).

Figure 6B:
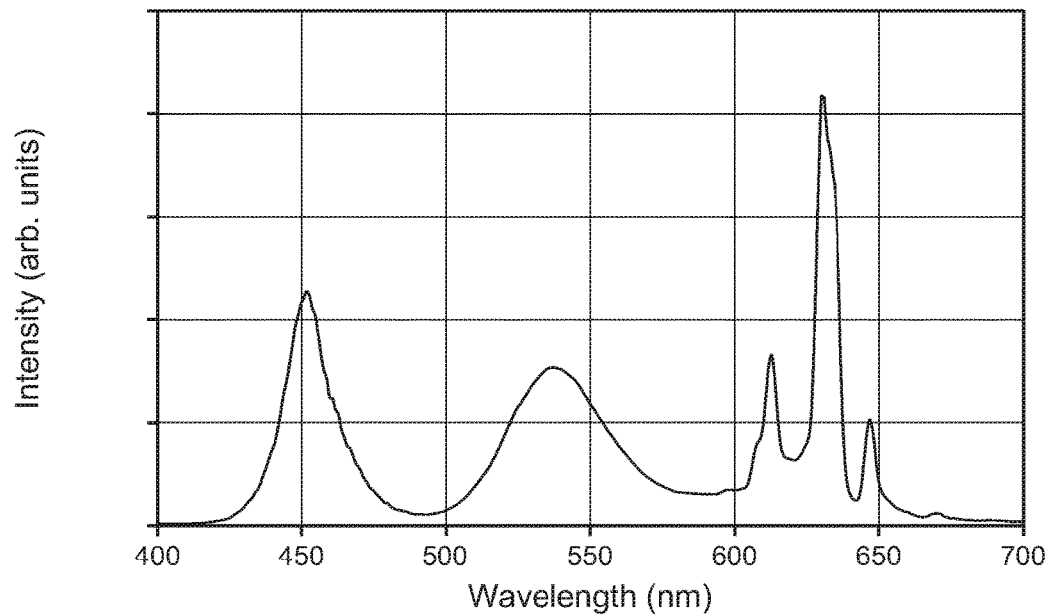
FIG. 6B shows the simulated emission spectrum of the LED of FIG. 6A as transmitted through the color filters.
Figure 6C:
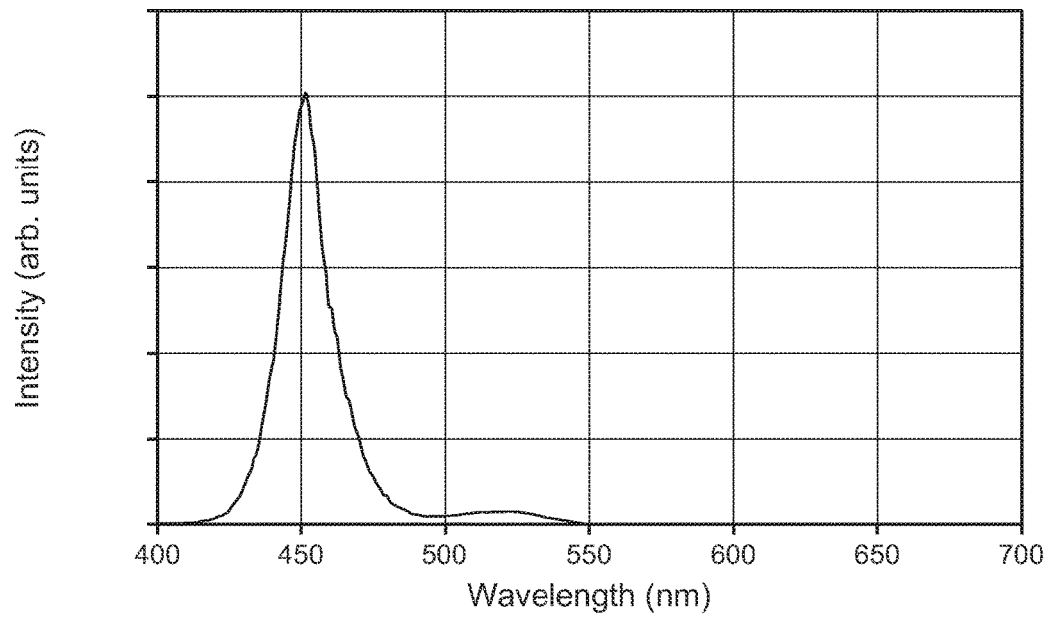
FIG. 6C shows the simulated emission spectrum of the LED of FIG. 6A as transmitted through the blue color filter.
Figure 6D:
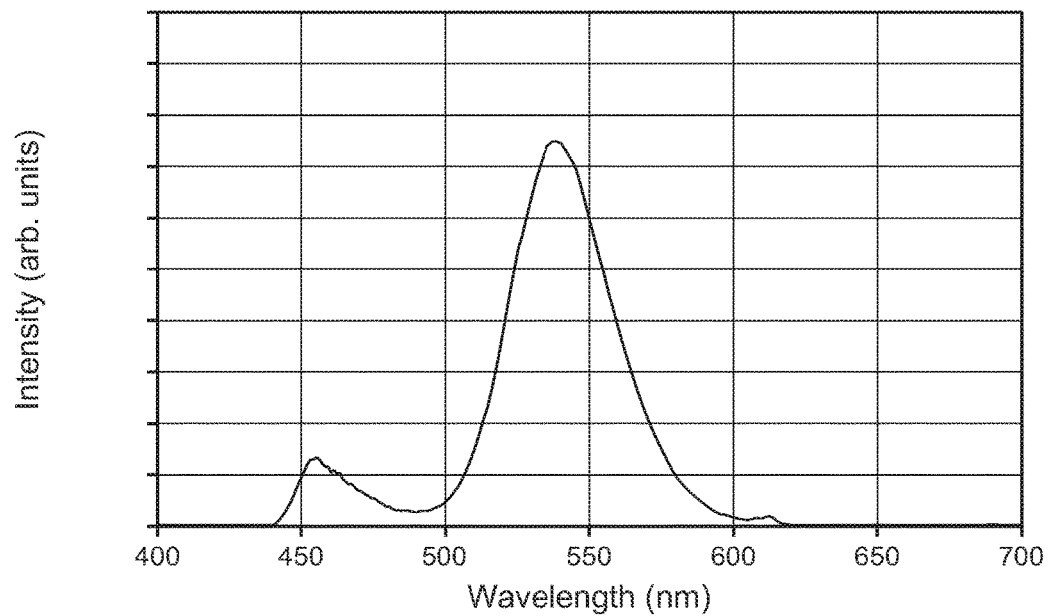
FIG. 6D shows the simulated emission spectrum of the LED of FIG. 6A as transmitted through the green color filter.
Figure 6E:
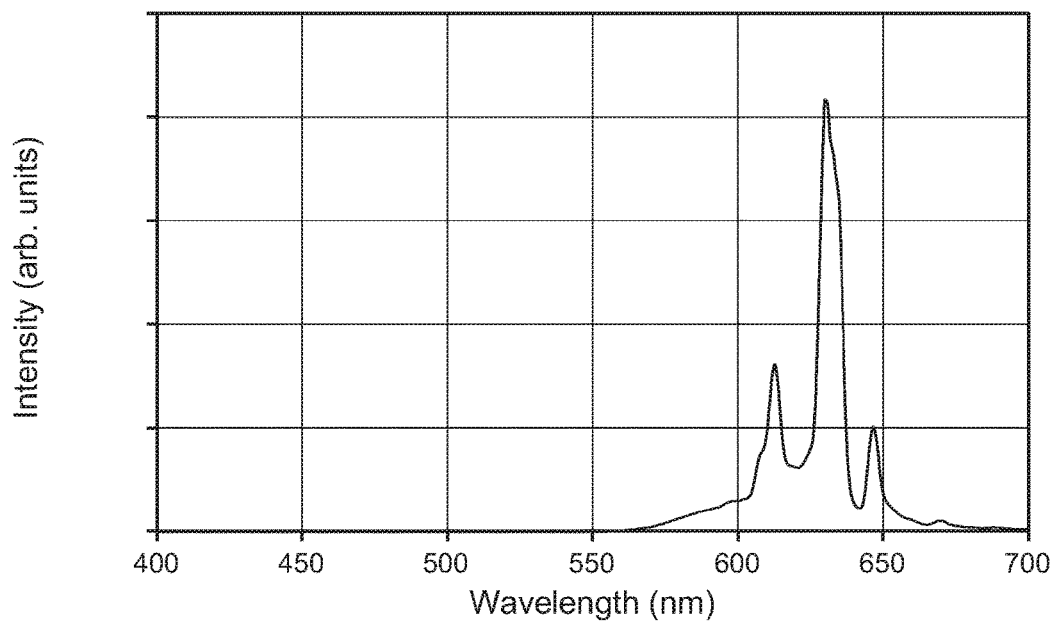
FIG. 6E shows the simulated emission spectrum of the LED of FIG. 6A as transmitted through the red color filter.
Figure 6F:
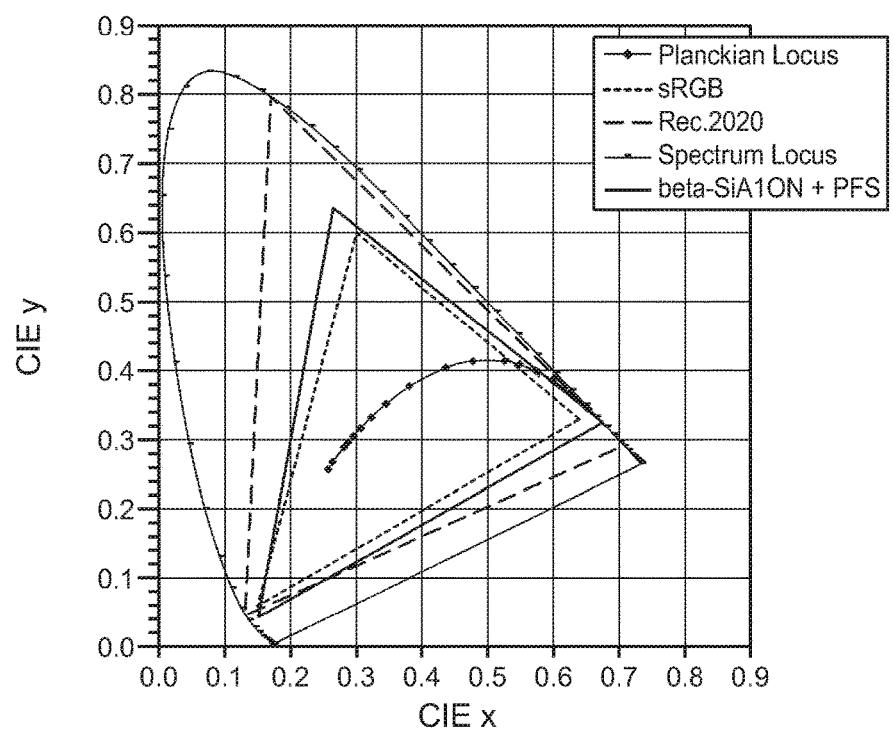
FIG. 6F shows a CIE 1931 x,y Chromaticity Diagram on which is plotted a simulated color gamut for the backlit LCD display of FIG. 6B. The sRGB and Rec. 2020 gamuts are also plotted, for reference.

FIG. 6B shows the through-filter white spectrum of the LED tuned to CIE x,y (0.333, 0.333). FIG. 6C shows the blue subpixel, FIG. 6D shows the green subpixel, and FIG. 6E shows the red subpixel. FIG. 6F compares the simulated gamut of a backlit LCD display using the LED with the sRGB and Rec. 2020 gamuts. Rec.2020 coverage is 62.3% in CIE 1931 color space. (The example color filter set illustrated in FIG. 1A is used throughout this disclosure, though those skilled in the art will know that the individual color filters may be switched and the relative transmission may be manipulated.)

Figure 6G:
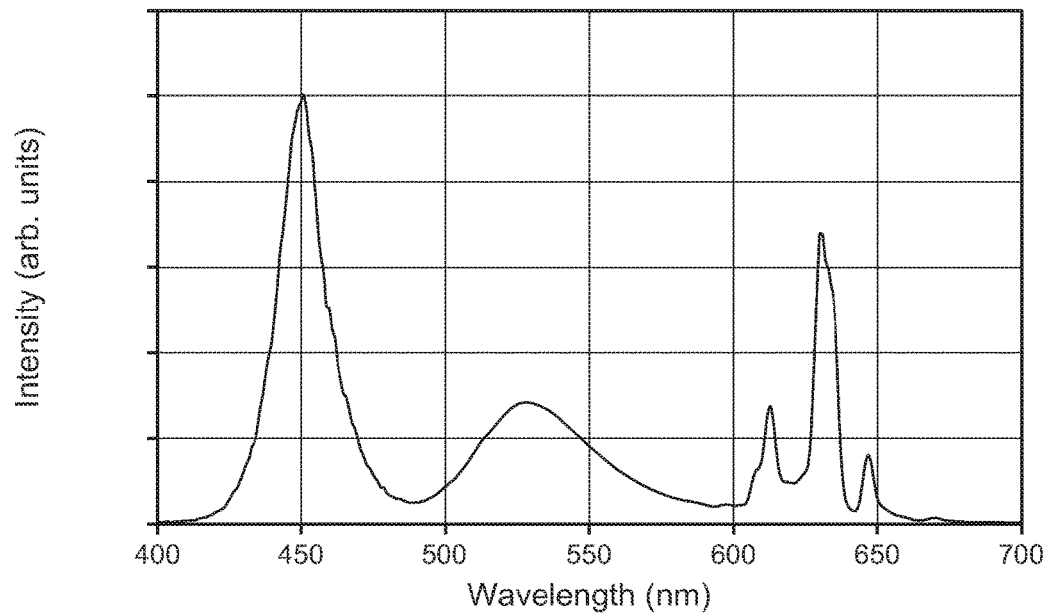
FIG. 6G shows the simulated emission spectrum from another conventional phosphor-converted white LED.
Figure 6H:
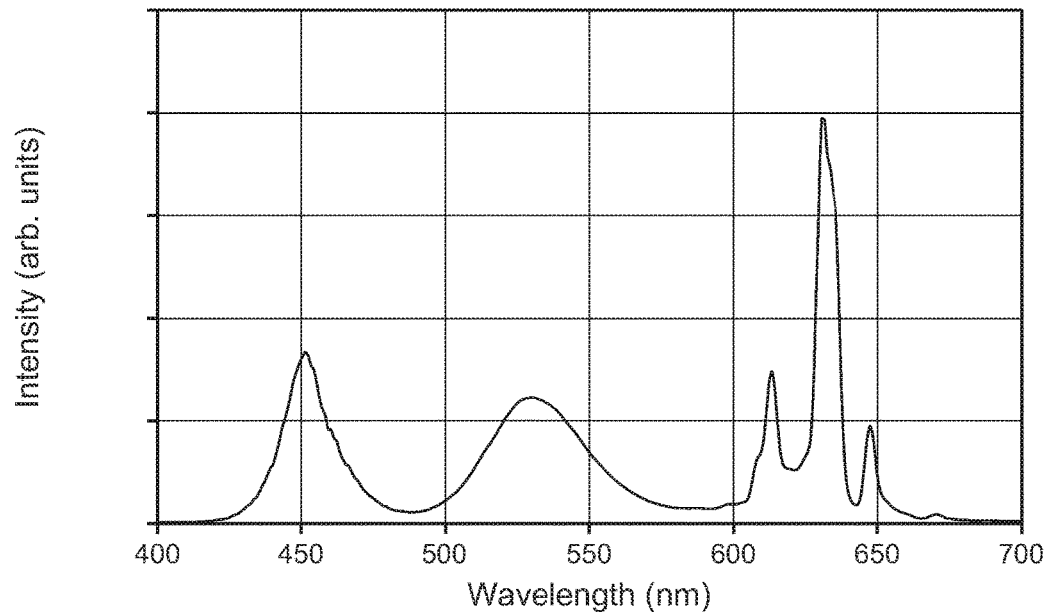
FIG. 6H shows the simulated emission spectrum of the LED of FIG. 6H as transmitted through the color filters of FIG. 1A.

As a second comparative example of a conventional phosphor-converted white LED used in a back-lighting application, FIG. 6G shows the simulated emission spectrum from a phosphor-converted LED using green phosphor beta-SiAlON with a peak wavelength of 528 nm and FWHM 49 nm, a red PFS phosphor, and a blue LED with color coordinates CIE x,y (0.249, 0.224). FIG. 6H shows the through-filter white spectrum of the LED tuned to CIE x,y (0.333, 0.333). This corresponds to a gamut area coverage of 70.0% versus Rec.2020 in CIE 1931 (x,y) color space.

Figure 6I:
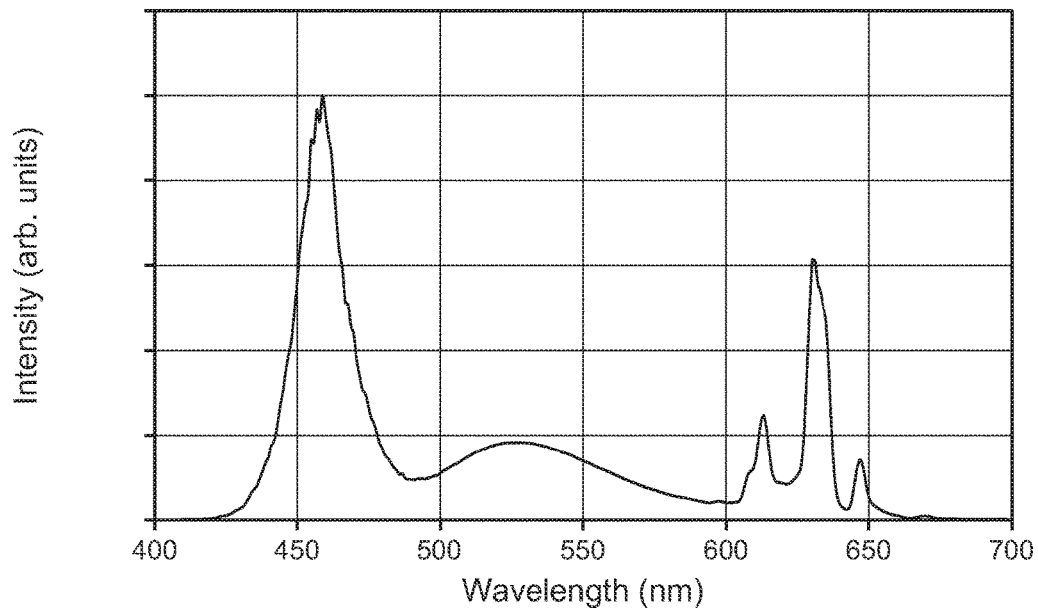
FIG. 6I shows the simulated emission spectrum from another conventional phosphor-converted white LED.
Figure 6J:
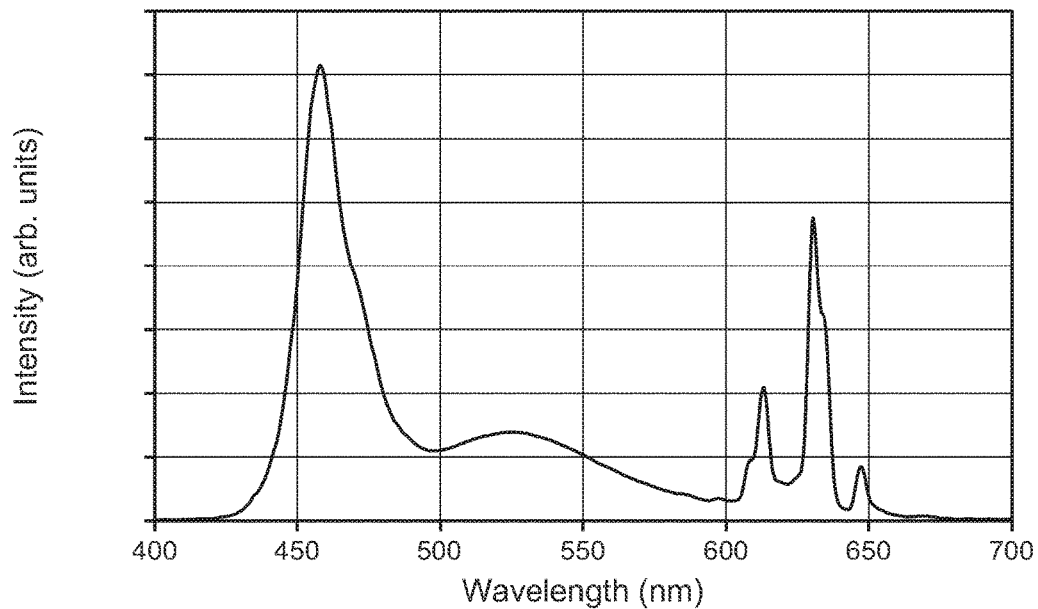
FIG. 6J shows the emission spectrum from a conventional phosphor-converted white LED, approximately matching that of FIG. 6I.

As a third comparative example of a conventional phosphor-converted white LED used in a back-lighting application, FIG. 6I shows the simulated emission spectrum from a phosphor-converted LED using a green phosphor orthosilicate phosphor (such as Isiphor RGA 524 500 available from Merck KGaA), a red PFS phosphor, and a blue LED. FIG. 6J shows the emission spectrum from a phosphor-converted LED that was fabricated from Dow Corning OE6550, Isiphor RGA 524 500 green phosphor, a PFS red phosphor, and PowerOpto 457 nm 2835 packages.

Narrow green phosphors of the current invention may comprise, for example, compositions of the form $Eu(Al_{1-z}Ga_z)_xS_y$ or $Ca_{1-w}Eu_w(Al_{1-z}Ga_z)_xS_y$, where x is between 2.0 and 4.0 inclusive, and y is between 4 and 7 inclusive, z is between 0 and 1 inclusive, and w is between 0 and 1 inclusive, but not equal to zero.

Green Phosphor Examples

Example 1

In comparison to the conventional backlighting examples just described, substituting a phosphor of the current invention with a peak emission wavelength of 540 nm and a full width at half maximum of 40 nm for the broader beta-SiAlON has the dual impact of expanding the green gamut point because the green phosphor is more color saturated, and expanding the red gamut point because the bleed through of the green phosphor through the red filter is reduced.

One such phosphor material is $Eu(Al_{1/3}Ga_{2/3})_{2.7}S_{5.05}$, peak wavelength 541 nm, FWHM 40 nm. Solid solutions of $Eu(Al_{0.33}Ga_{0.67})_{2.7}S_{5.05}$ were prepared by combining preformed $EuAl_{2.7}S_{5.05}$ and $EuGa_{2.7}S_{5.05}$ in appropriate amounts and heating to 1200° C. in evacuated carbon-coated tubes. $EuAl_{2.7}S_{5.05}$ was formed by combining Eu, Al, and S in appropriate amounts and heating to 1000° C. in evacuated carbon-coated tubes. $EuAl_{2.7}S_{5.05}$ was formed by combining Eu, $Ga_2S_3$, and S in appropriate amounts and heating to 800° C. in evacuated carbon-coated tubes.

Figure 7A:
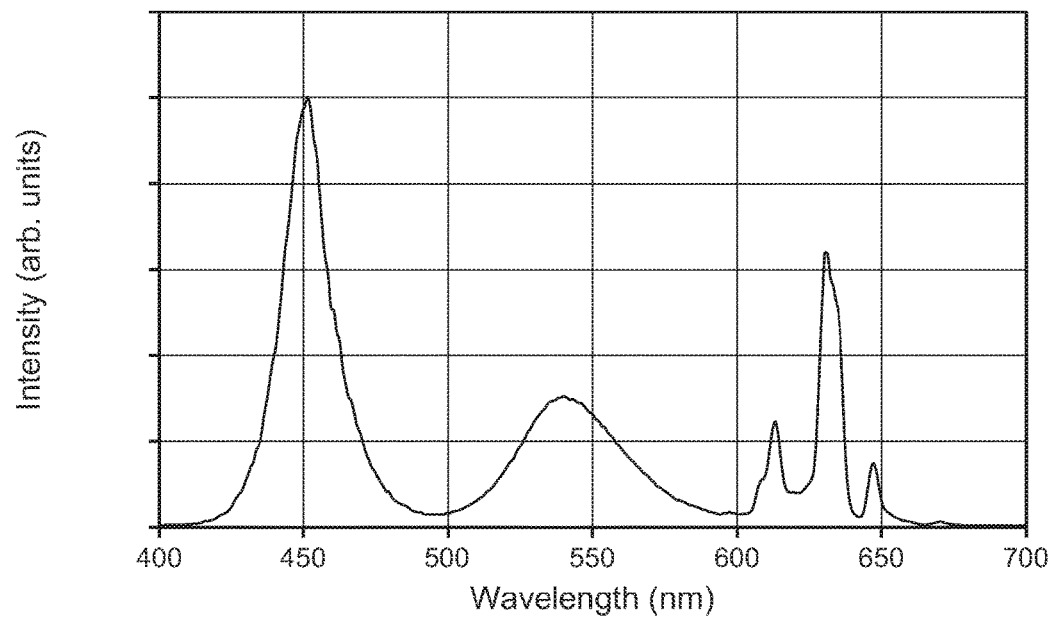
FIG. 7A shows the simulated emission spectrum from a phosphor-converted white LED of example 1 described below.
Figure 7B:
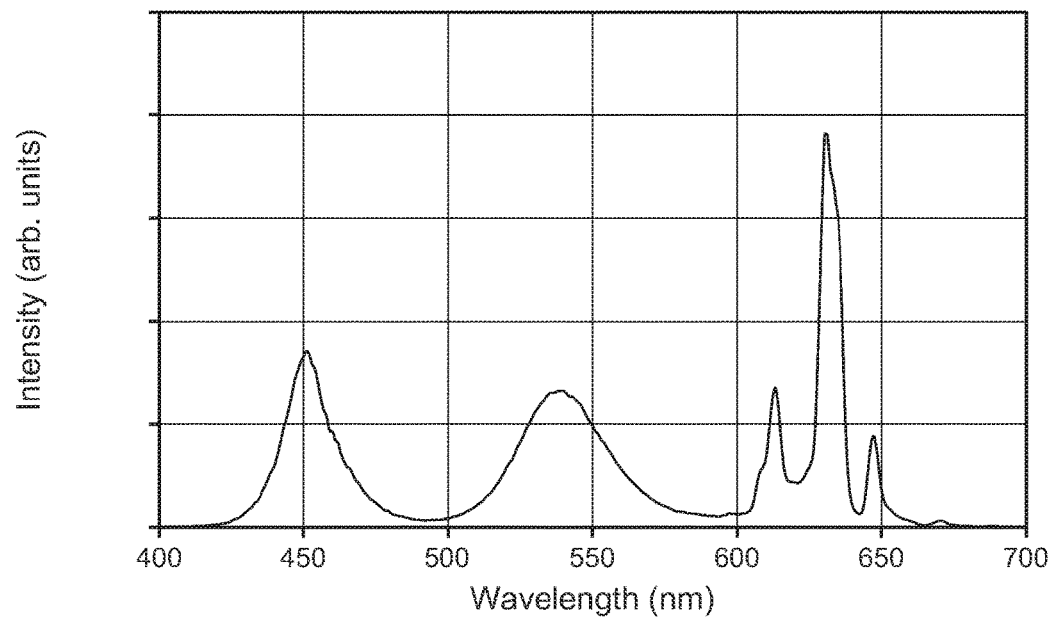
FIG. 7B shows the simulated emission spectrum of the LED of FIG. 7A as transmitted through the color filters of FIG. 1A.
Figure 7C:
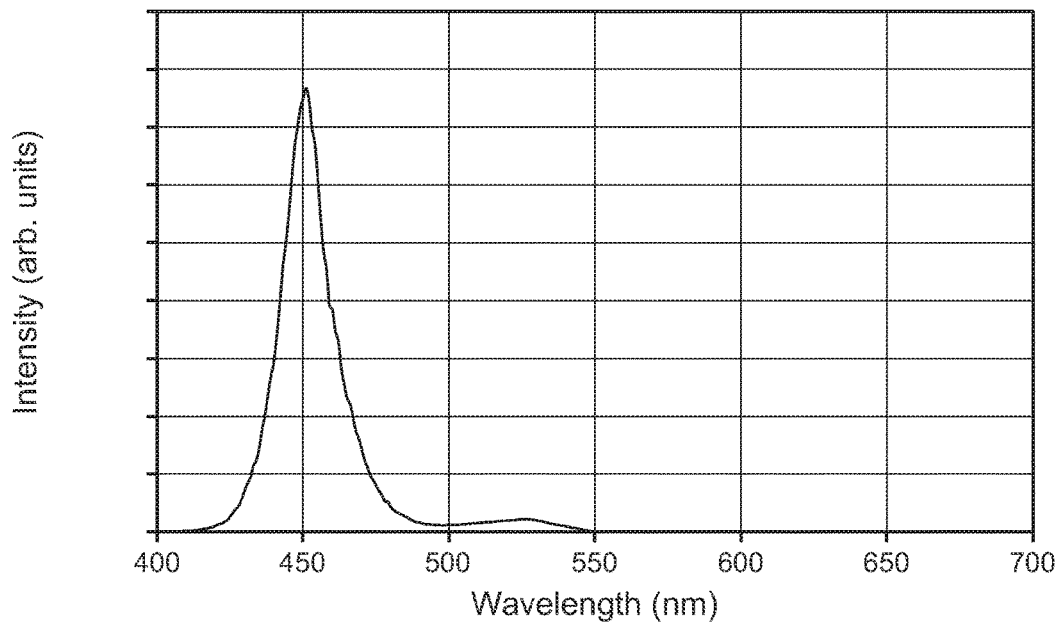
FIG. 7C shows the simulated emission spectrum of the LED of FIG. 7A as transmitted through the blue color filter.
Figure 7D:
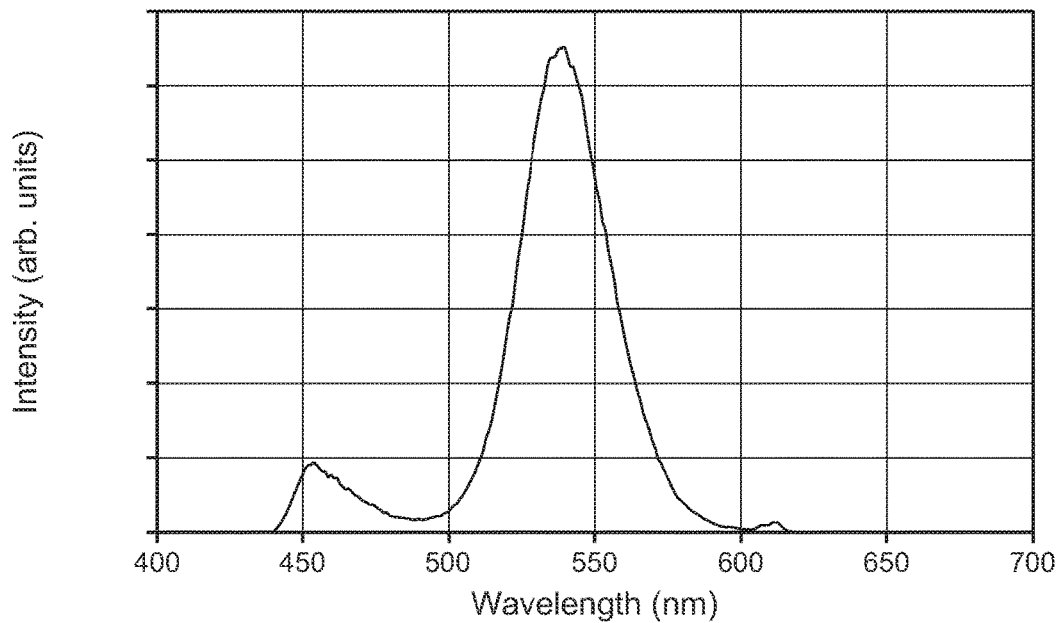
FIG. 7D shows the simulated emission spectrum of the LED of FIG. 7A as transmitted through the green color filter.
Figure 7E:
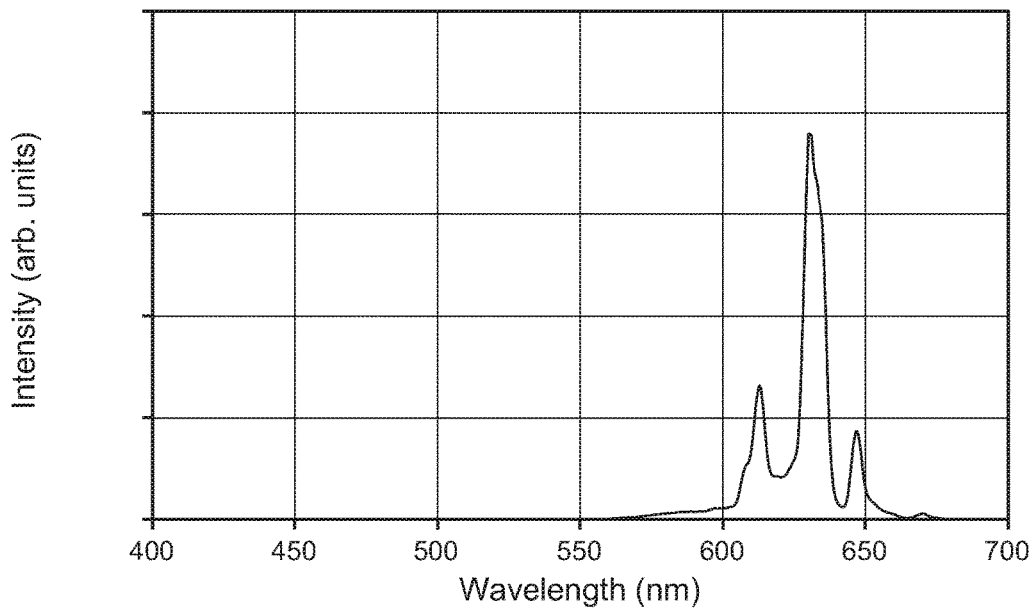
FIG. 7E shows the simulated emission spectrum of the LED of FIG. 7A as transmitted through the red color filter.
Figure 7F:
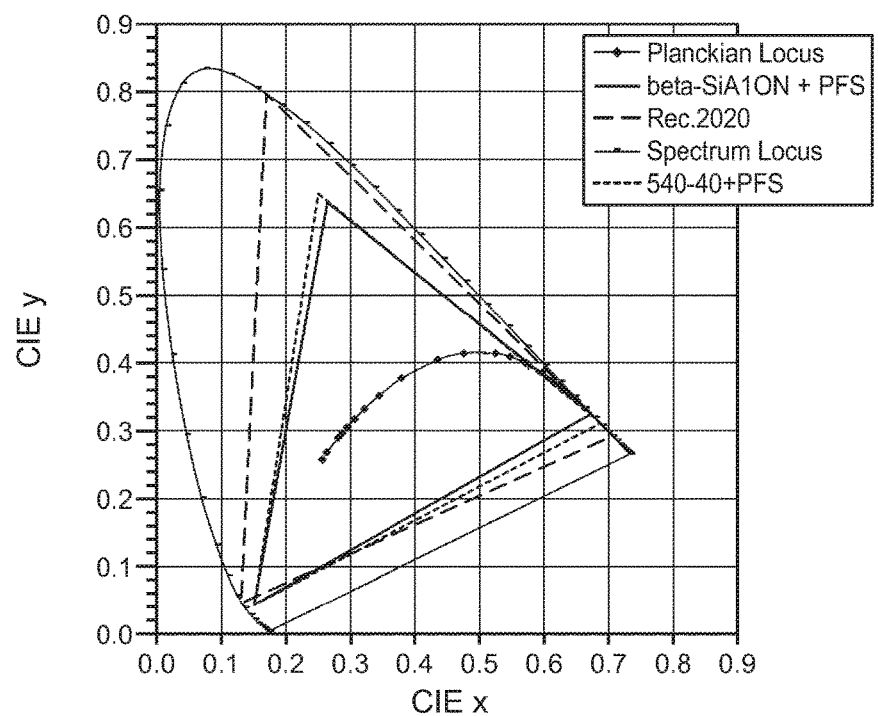
FIG. 7F shows a CIE 1931 x,y Chromaticity Diagram on which are plotted a simulated color gamut for the backlit LCD display of FIG. 6B and a simulated color gamut for the backlit LCD display of FIG. 7B. The Rec. 2020 gamut is also plotted, for reference.

FIG. 7A shows the simulated emission spectrum from a phosphor converted LED in which green phosphor $Eu(Al_{0.33}Ga_{0.67})_{2.7}S_{5.05}$ has been substituted for the green phosphor in the first comparative example. The emission spectrum has color coordinates CIE x,y (0.252, 0.223). FIG. 7B shows the through-filter white spectrum of the LED tuned to CIE x,y (0.333, 0.333). FIG. 7C shows the blue subpixel, FIG. 7D shows the green subpixel, and FIG. 7E shows the red subpixel. FIG. 7F compares the simulated gamut of a backlit LCD display using the LED with that for the comparative beta-SiAlON LED and with the Rec. 2020 gamut. The Rec.2020 coverage is 68.3% in CIE 1931 (x,y) color space. A comparison of the red sub-pixels in FIGS. 6E and 7E shows that narrowing the green phosphor emission by circa 15 nm results in a reduction of emitted intensity between 550 and 600 nm in the red sub-pixel.

Example 2

Figure 8A:
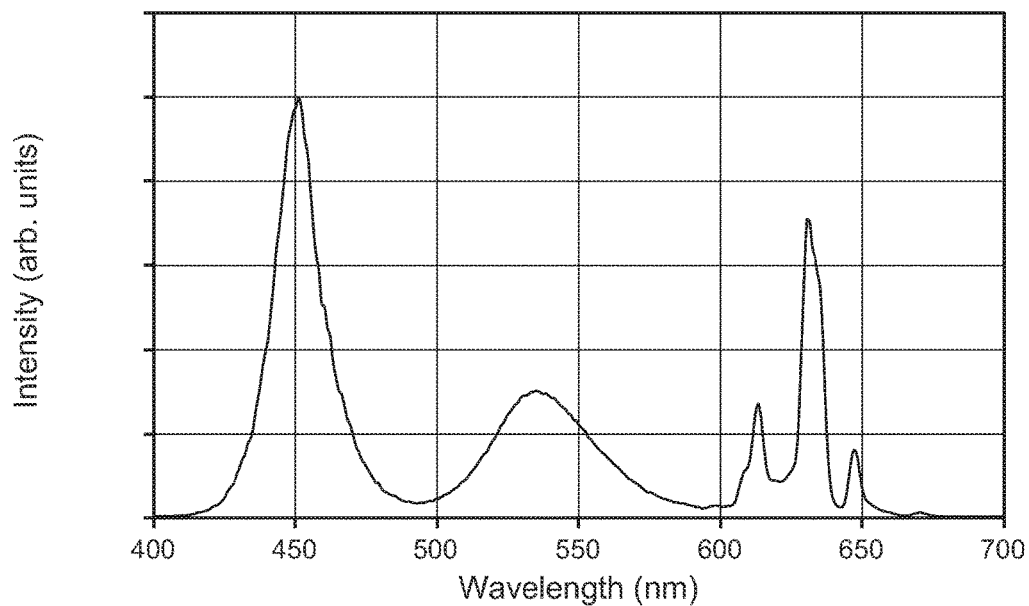
FIG. 8A shows the simulated emission spectrum from a phosphor-converted white LED of example 2 described below.
Figure 8B:
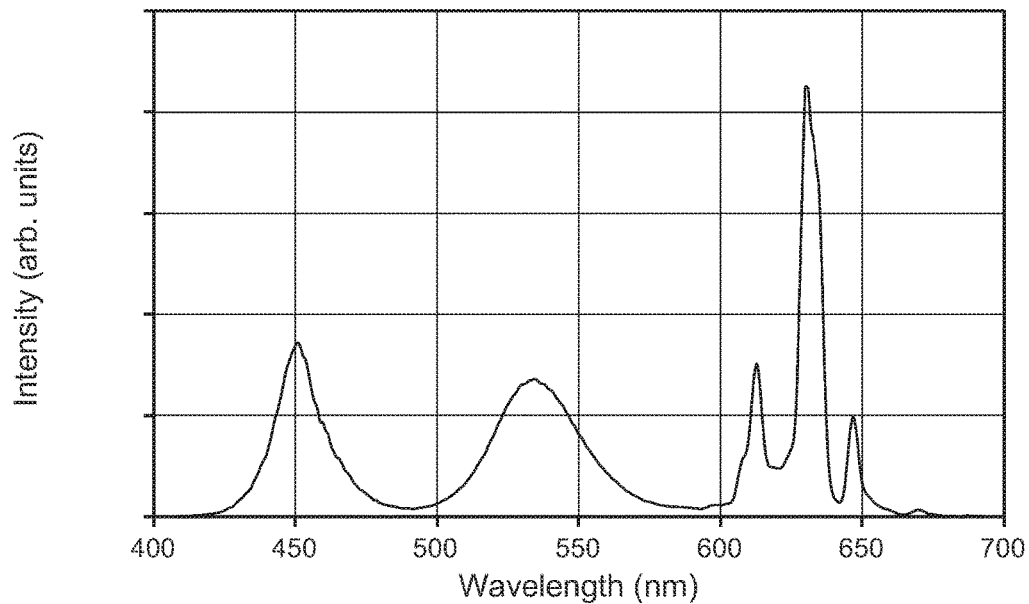
FIG. 8B shows the simulated emission spectrum of the LED of FIG. 8A as transmitted through the color filters of FIG. 1A.
Figure 8C:
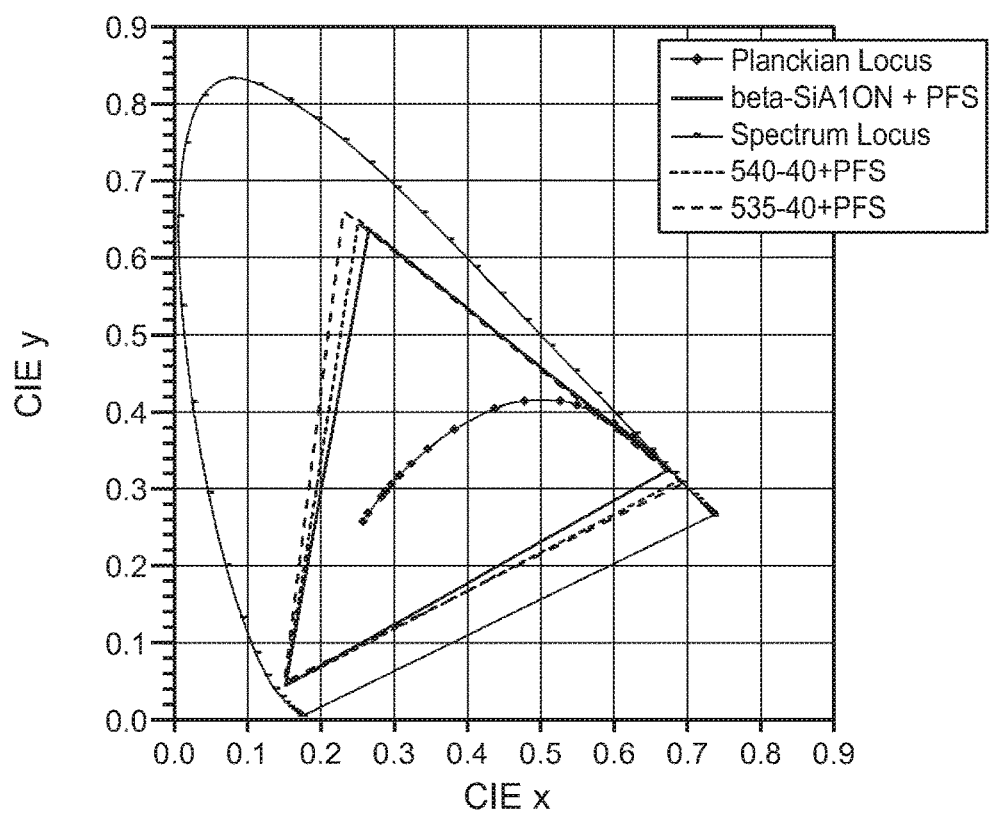
FIG. 8C shows a CIE 1931 x,y Chromaticity Diagram on which are plotted a simulated color gamut for the backlit LCD display of FIG. 6B, a simulated color gamut for the backlit LCD display of FIG. 7B, and a simulated color gamut for the backlit LCD display of FIGS. 8A-8B.

FIGS. 8A-8C show the result of blue-shifting the peak wavelength of the green phosphor 5 nm to 535 nm while maintaining its FWHM at 40 nm. FIG. 8A shows the simulated emission spectrum from such a phosphor converted LED, with color coordinates CIE x,y (0.249, 0.221). FIG. 8B shows the through-filter white spectrum of the LED tuned to CIE x,y (0.333, 0.333). FIG. 8C compares the simulated gamut of a backlit LCD display using the LED to that for an LED from example 1 and to that of a comparative beta-SiAlON LED. With the 535 nm peak green phosphor, the green and red gamut points are expanded, and the gamut covers 71.0% of the Rec.2020 gamut in CIE x,y.

One such phosphor is $EuAl_{1.16}Ga_{1.74}S_{5.35}$, peak wavelength 535 nm, FWHM 42 nm. This phosphor was synthesized by combining Eu, $Al_2S_3$ and $Ga_2S_3$ to make a stoichiometric ratio of the metals. A few wt % $AlCl_3$ was added, and the mixture was ground in an argon filled glovebox and sealed in a fused silica tube. The mixture was heated at 400° C. for 1 hour, then the temperature was increased and held at 850° C. for 6 hours. The product was cooled to room temperature at about 25° C./hour.

Another such phosphor is $EuAlGaS_4$ (disclosed in U.S. application 62/539,233, filed Jul. 31, 2017 and incorporated herein by reference in its entirety), peak wavelength 533 nm, FWHM 41 nm. This phosphor was synthesized by combining Eu, $Al_2S_3$, $Ga_2S_3$ and S in stoichiometric amounts under Ar. The mixture was sealed in an evacuated quartz tube and heated to 400° C. (6 h) then to 800° C. (12 h). After grinding the product and adding 50 mg excess S, a second heat treatment was followed, by heating to 400° C. (6 h) then to 1000° C. (6 h).

Example 3

Figure 9A:
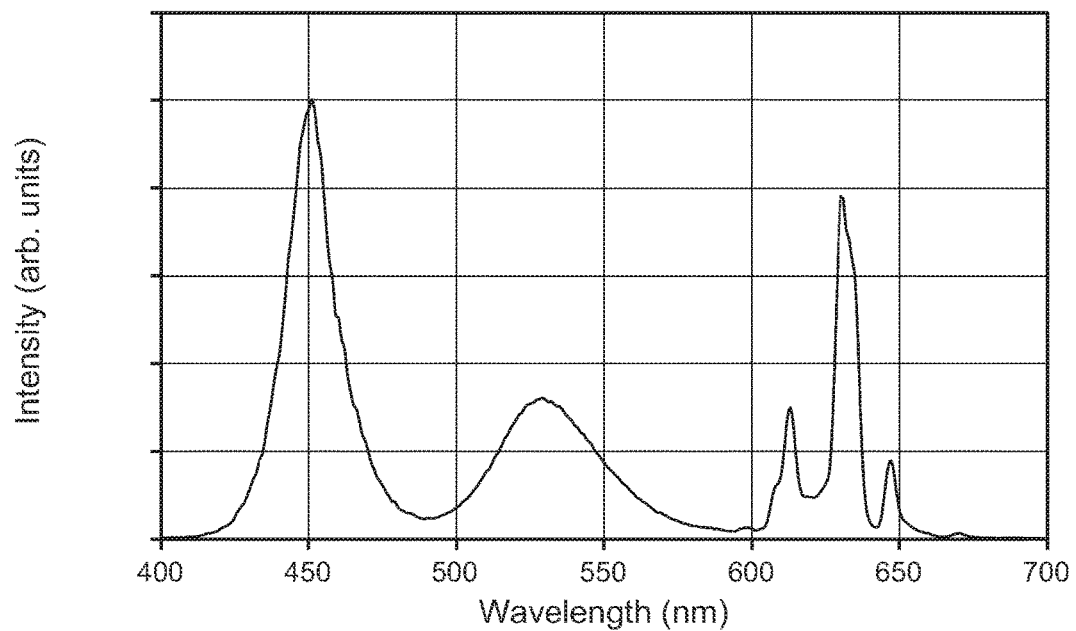
FIG. 9A shows the simulated emission spectrum from a phosphor-converted white LED of example 3 described below.
Figure 9B:
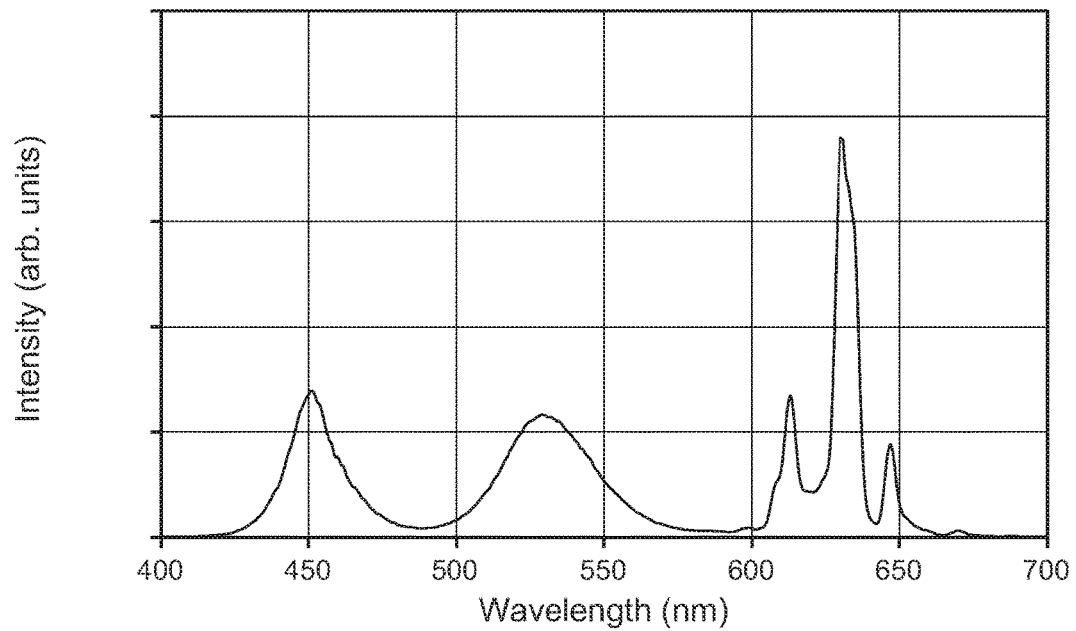
FIG. 9B shows the simulated emission spectrum of the LED of FIG. 9A as transmitted through the color filters of FIG. 1A.
Figure 9C:
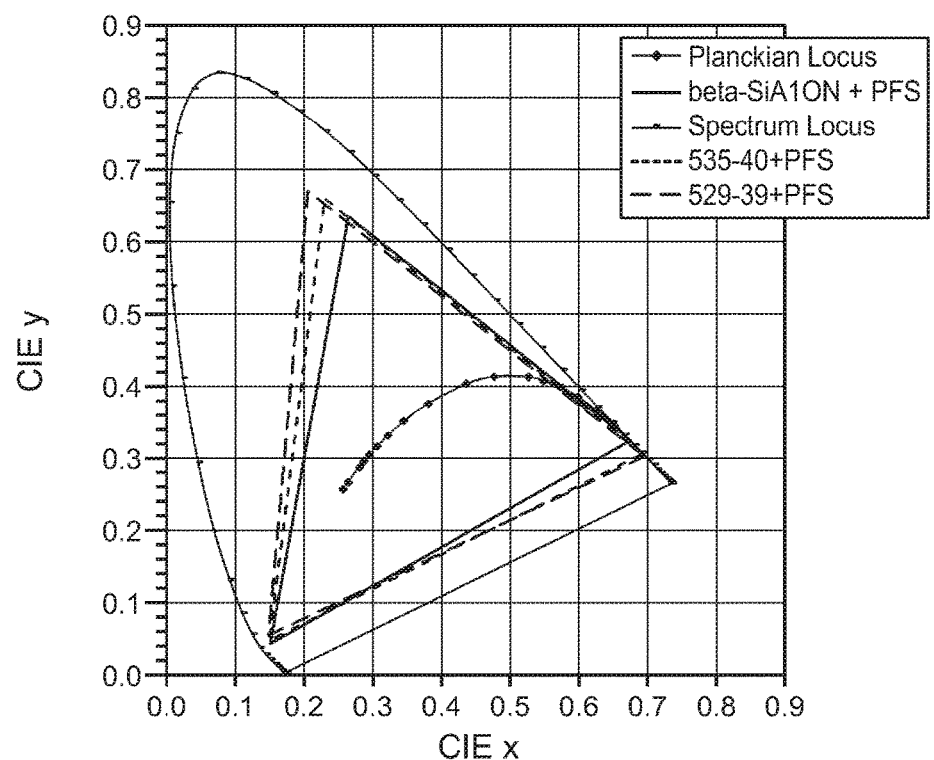
FIG. 9C shows a CIE 1931 x,y Chromaticity Diagram on which are plotted a simulated color gamut for the backlit LCD display of FIG. 6B, a simulated color gamut for the backlit LCD display of FIG. 8B, and a simulated color gamut for the backlit LCD display of FIG. 9B.

FIGS. 9A-9C show the result of blue-shifting the peak wavelength of the green phosphor another 6 nm to 529 nm, and reducing the FWHM by 1 more nm to 39 nm. FIG. 9A shows the simulated emission spectrum from such a phosphor converted LED, with color coordinates CIE x,y (0.246, 0.220). FIG. 9B shows the through-filter white spectrum of the LED tuned to CIE x,y (0.333, 0.333). FIG. 9C compares the simulated gamut of a backlit LCD display using the LED to that for an LED from example 2 and to that of the first comparative beta-SiAlON LED. With the 529 nm green phosphor, the green gamut point is expanded. There is negligible impact on the red gamut point. The blue gamut point is slightly desaturated, because the green peak has moved close enough to begin bleeding though the blue filter. The gamut covers 73.6% of the Rec.2020 gamut in CIE x,y.

One such phosphor is $EuAl_{1.5}Ga_{1.2}S_{4.47}$, peak wavelength 529 nm, and FWHM 39 nm. This phosphor is synthesized by combining 0.562 g Eu powder, 0.416 g $Al_2S_3$, 0.522 g $Ga_2S_3$, 0.050 g S and 0.115 g $AlCl_3$ and grinding in a mortar and pestle in an argon filled glovebox. The mixture was divided into 4 quartz tubes that were sealed under vacuum. The tubes were heated to 400° C. for one hour and then heated at 900° C. for 6 hours. Then the tubes were cooled to room temperature at 50° C./hour.

Example 4

Figure 10A:
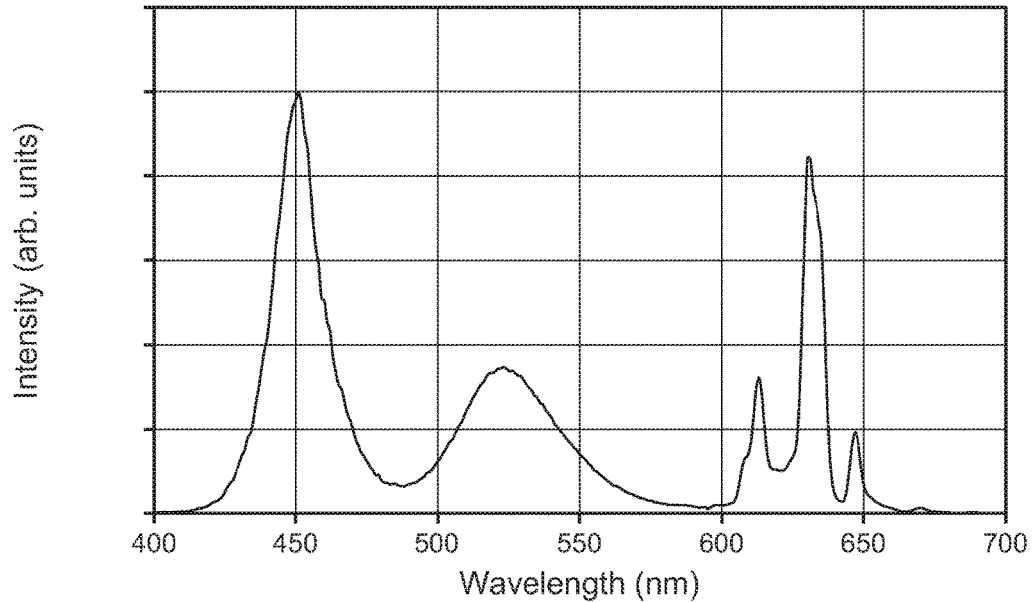
FIG. 10A shows the simulated emission spectrum from a phosphor-converted white LED of example 4 described below.
Figure 10B:
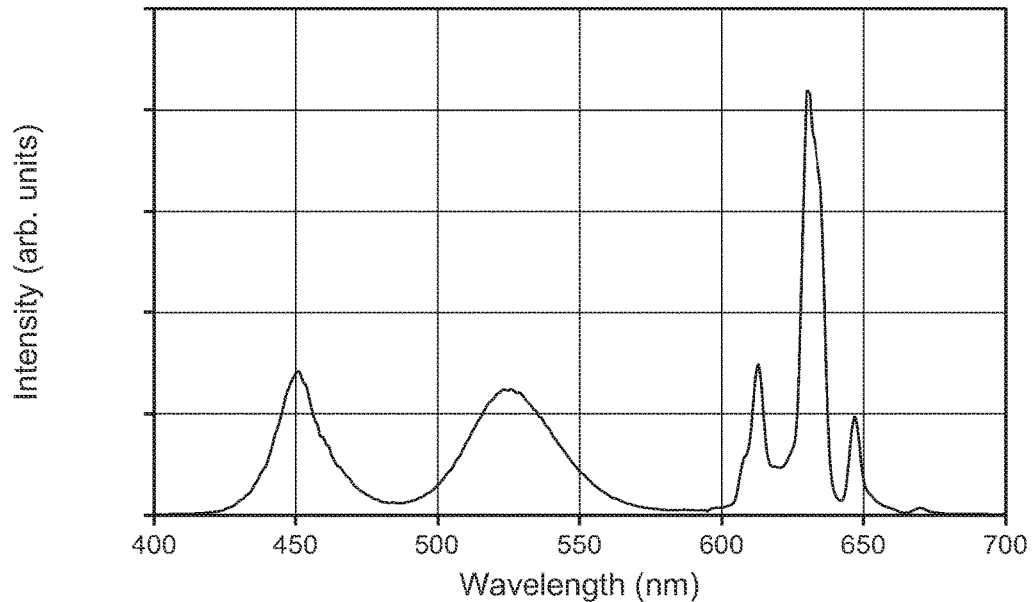
FIG. 10B shows the simulated emission spectrum of the LED of FIG. 10A as transmitted through the color filters of FIG. 1A.
Figure 10C:
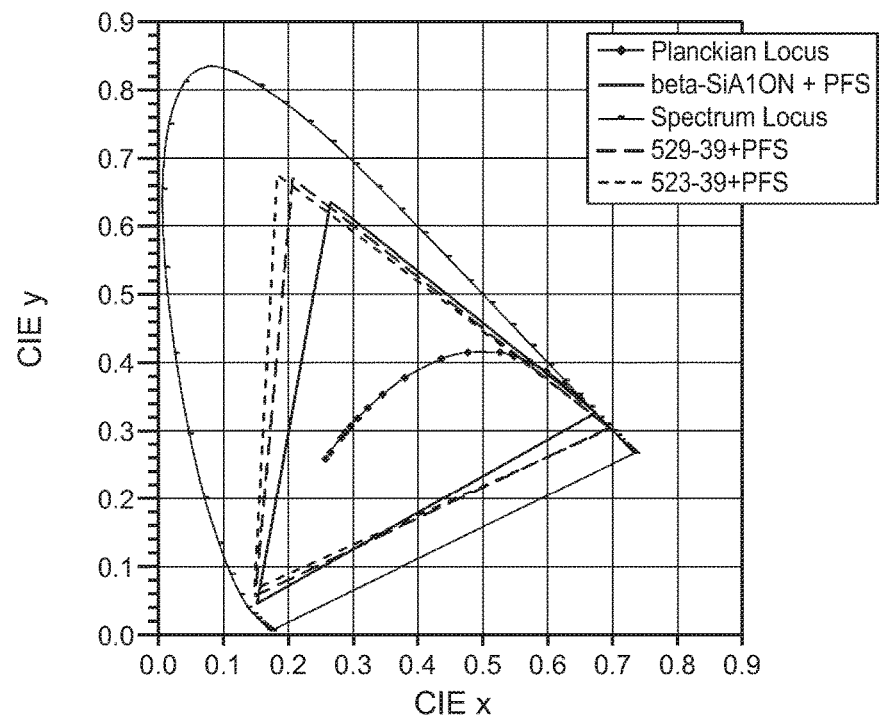
FIG. 10C shows a CIE 1931 x,y Chromaticity Diagram on which are plotted a simulated color gamut for the backlit LCD display of FIG. 6B, a simulated color gamut for the backlit LCD display of FIG. 9B, and a simulated color gamut for the backlit LCD display of FIG. 10B.

FIGS. 10A-10C show the result of blue-shifting the peak wavelength of the green phosphor another 6 nm to 523 nm while maintaining the FWHM at 39 nm. FIG. 10A shows the simulated emission spectrum from such a phosphor converted LED, with color coordinates CIE x,y (0.243, 0.222). FIG. 10B shows the through-filter white spectrum of the LED tuned to CIE x,y (0.333, 0.333). FIG. 10C compares the simulated gamut of a backlit LCD display using the LED to that for an LED from example 3 and to that of the first comparative beta-SiAlON LED. With the 523 nm green phosphor, the green gamut point is further expanded. There is negligible impact on the red gamut point. The blue gamut point is slightly more desaturated. The gamut covers 74.9% of the Rec.2020 gamut in CIE x,y.

One such phosphor is $Ca_{0.915}Eu_{0.085}(Al_{0.9}Ga_{0.1})_3S_{5.5}$, peak wavelength 523 nm, FWHM 39 nm. This phosphor was synthesized by combining CaS, $EuF_3$, Al metal, $Ga_2S_3$, and S in stoichiometric ratios under argon. Reactants were mixed using a SpeedMixer followed by secondary manual grinding using a mortar and pestle. Reactants were heated under an Ar/$H_2$S mixture, first with an intermediate dwell at 700 Celsius, followed by 1-2 hours at a temperature between 950 and 1100 Celsius. All temperature ramps were at 10° C./min.

Another such phosphor is $Eu(Al_{1/3}Ga_{2/3})_{2.7}S_{5.05}$, peak wavelength 523 nm, FWHM 39 nm. To synthesize this phosphor, solid solutions of $Eu(Al_{0.33}Ga_{0.67})_{2.7}S_{5.05}$ were prepared by combining pre-formed $EuAl_{2.7}S_{5.05}$ and $EuGa_{2.7}S_{5.05}$ in appropriate amounts with a few weight % LiCl and heating to 1200° C. in evacuated carbon-coated tubes. $EuAl_{2.7}S_{5.05}$ was formed by combining Eu, Al, and S in appropriate amounts and heating to 1000° C. in evacuated carbon-coated tubes. $EuAl_{2.7}S_{5.05}$ was formed by combining Eu, $Ga_2S_3$, and S in appropriate amounts and heating to 800° C. in evacuated carbon-coated tubes.

Another such phosphor is $Ca_{0.5}Eu_{0.5}Al_{2.25}Ga_{0.75}S_{5.5}$, peak wavelength of 525 nm and FWHM of 39 nm. This phosphor was synthesized from pre-formed $EuAl_{2.5}S_{4.75}$ ($Eu_2O_3$ (1.084 g, 3.08 mol) and 0.415 g of Al powder (0.415 g, 15.41 mol) were combined and fired at 900° C. for 1 hour under $H_2S$ atmosphere in an alumina boat), CaS, Al, $Ga_2S_3$, and 10% CsCl flux at 950° C. under flowing $H_2S$.

Another such phosphor is $Eu_{0.31}Ca_{0.69}Al_{1.03}Ga_{0.97}S_4$, peak wavelength of 524 nm and FWHM of 41 nm. To synthesize this phosphor $Eu_2O_3$ (1.084 g, 3.08 mol) and 0.415 g of Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break into a powder. 3 g of $EuAl_{2.5}S_{4.75}$ precursor, 0.2 g of Al powder, 0.3 g CaS, and 0.7 g $Ga_2S_3$ were hand-ground in a mortar with a pestle. The mixed powder was fired in an alumina cup at 960° C. for 2 hours under $H_2S$ atmosphere.

Figure 10D:
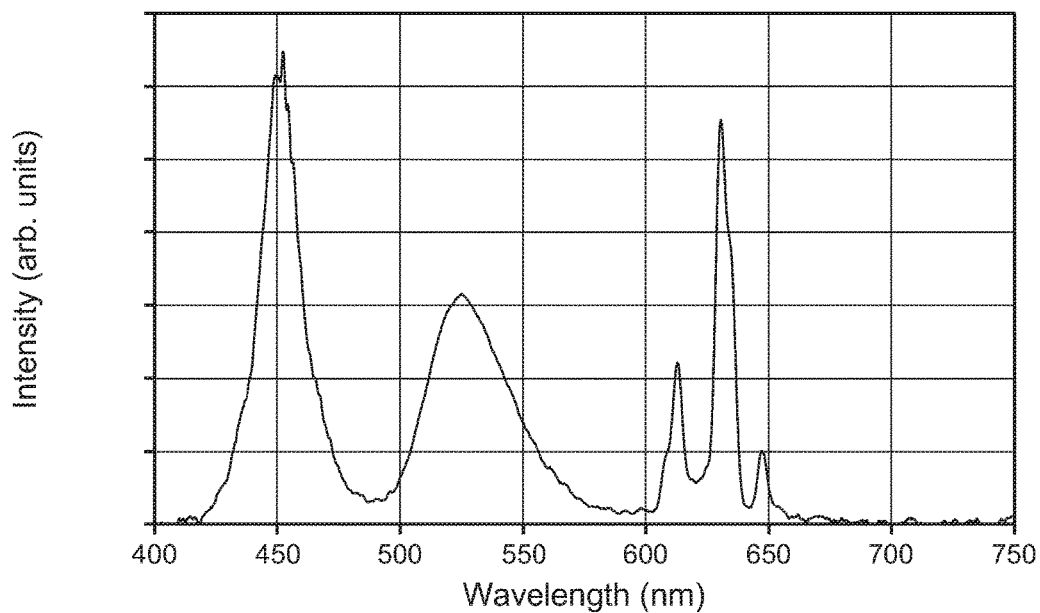
FIG. 10D shows an emission spectrum from example phosphor converted LED 1 described below, comprising a green phosphor from example 3 described below

Example phosphor converted LED 1 was fabricated from a blue LED (3535 package by Plessey), green phosphor $Ca_{0.5}Eu_{0.5}Al_{2.25}Ga_{0.75}S_{5.5}$, PFS red phosphor, and Dow Corning OE6550 silicone. FIG. 10D shoes the emission spectrum for this LED, which has color coordinate CIE x,y (0.2445, 0.2678).

Figure 10E:
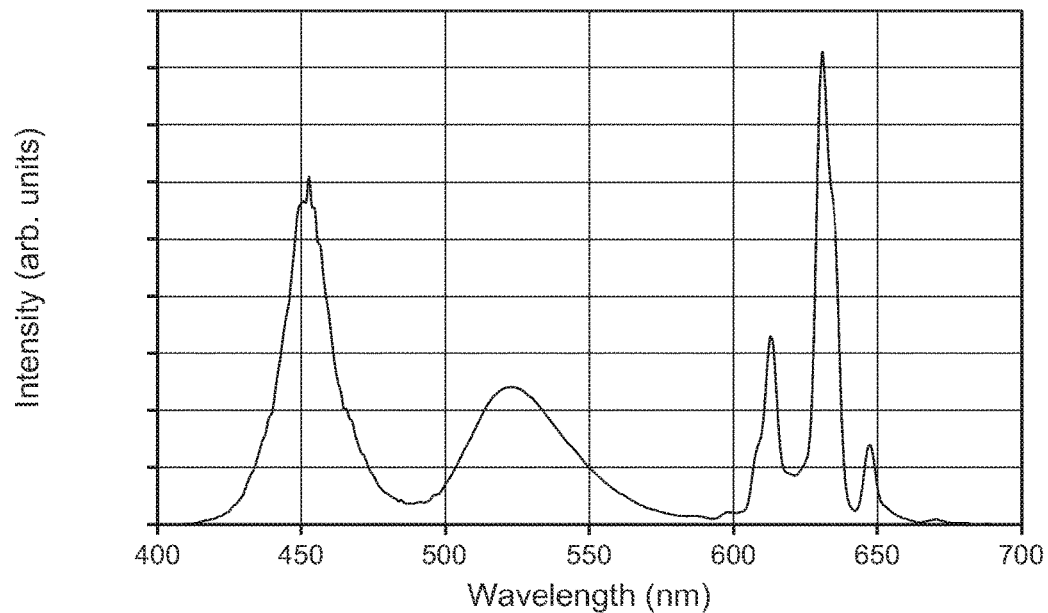
FIG. 10E shows an emission spectrum from example phosphor converted LED 2 described below, comprising another green phosphor from example 3 described below

Example phosphor converted LED 2 was fabricated from a blue LED (3535 package by Plessey), green phosphor $Eu_{0.31}Ca_{0.69}Al_{1.03}Ga_{0.97}S_4$, PFS red phosphor, and Dow Corning OE6550 silicone. FIG. 10E shows the emission spectrum for this LED, which has color coordinate CIE x,y (0.2780, 0.2473).

Example 5

Figure 11A:
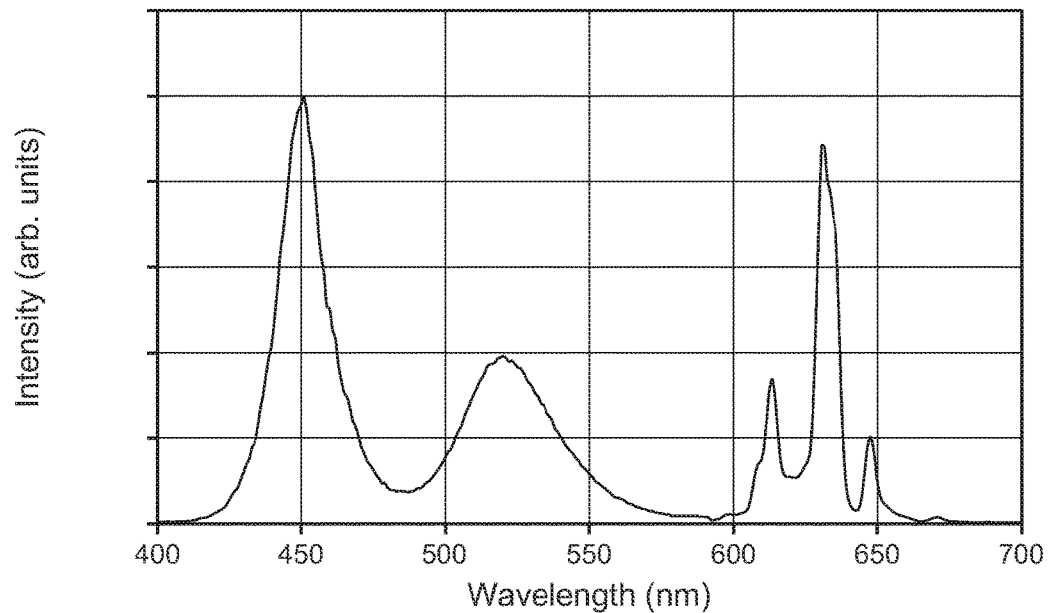
FIG. 11A shows the simulated emission spectrum from a phosphor-converted white LED of example 5 described below
Figure 11B:
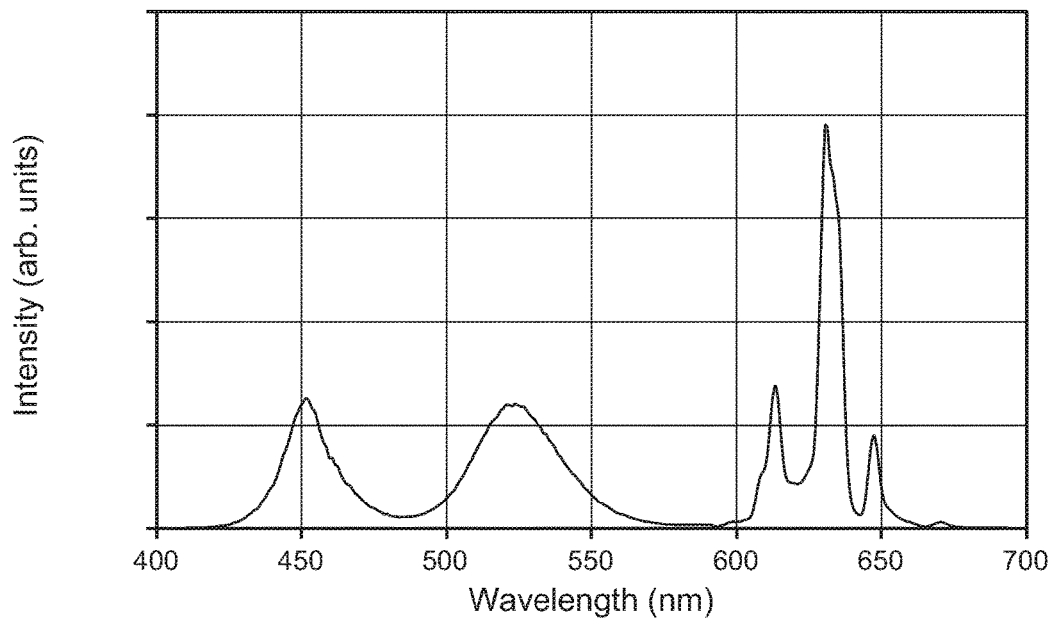
FIG. 11B shows the simulated emission spectrum of the LED of FIG. 11A as transmitted through the color filters of FIG. 1A.
Figure 11C:
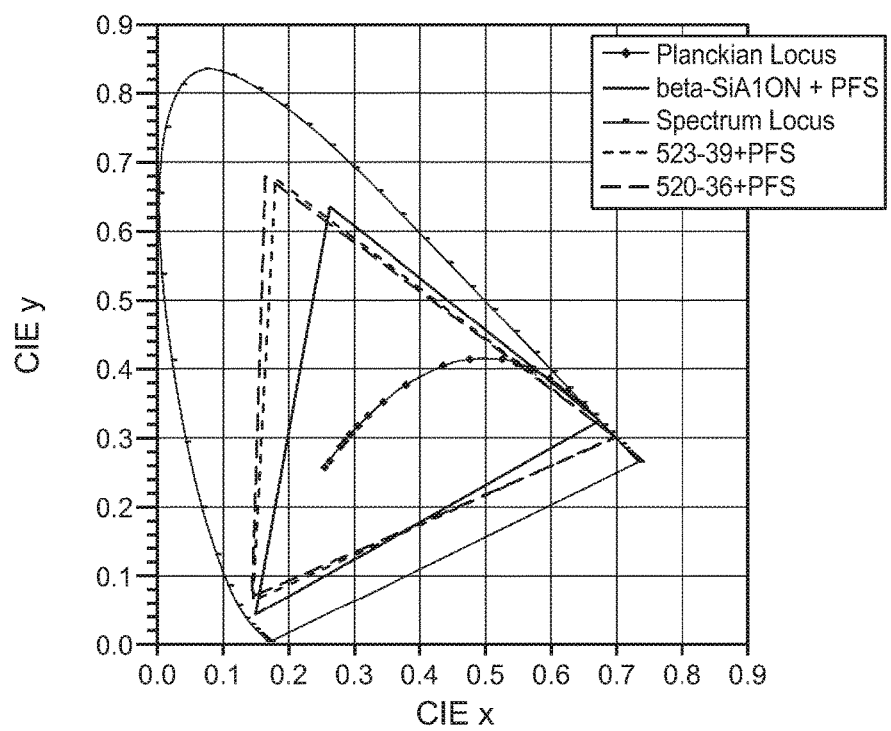
FIG. 11C shows a CIE 1931 x,y Chromaticity Diagram on which are plotted a simulated color gamut for the backlit LCD display of FIG. 6B, a simulated color gamut for the backlit LCD display of FIG. 10B, and a simulated color gamut for the backlit LCD display of FIG. 11B.

FIGS. 11A-11C show the result of blue-shifting the peak wavelength of the green phosphor another 3 nm to 520 nm and further narrowing the emission to a FWHM of 36 nm. FIG. 11A shows the simulated emission spectrum of such a phosphor converted LED, with color coordinates CIE x,y (0.241, 0.222). FIG. 11B shows the through-filter white spectrum tuned to CIE x,y (0.333, 0.333). FIG. 11C compares the simulated gamut of a backlit LCD display using the LED to that for an LED from example 4 and to that of the first comparative beta-SiAlON LED. With the 520 nm green phosphor, the green gamut point is further expanded. There is negligible impact on the red gamut point. The blue gamut point is yet slightly more desaturated. The gamut covers 75.9% of the Rec.2020 gamut in CIE x,y.

One such phosphor is $Ca_{0.915}Eu_{0.085}Al_{2.7}S_{5.05}$ (disclosed in U.S. 62/539,233), peak wavelength 520 nm peak and FWHM 36 nm. This phosphor was synthesized by combining CaS, Eu, Al and S in stoichiometric amounts. The mixture was homogenized in a mortar and pestle under Argon, then loaded into a carbon-coated silica tube which was subsequently evacuated and sealed under vacuum. Synthesis was carried out by a stepwise heating approach: 290° C. (17 h), 770° C. (24 h), 870° C. (24 h), and slow cooled over 20 h. The product was recovered and manually reground before returning to a new carbon-coated silica tube and heated to 400° C. (6 h) and 1000° C. (3 h).

Example 6

Figure 12A:
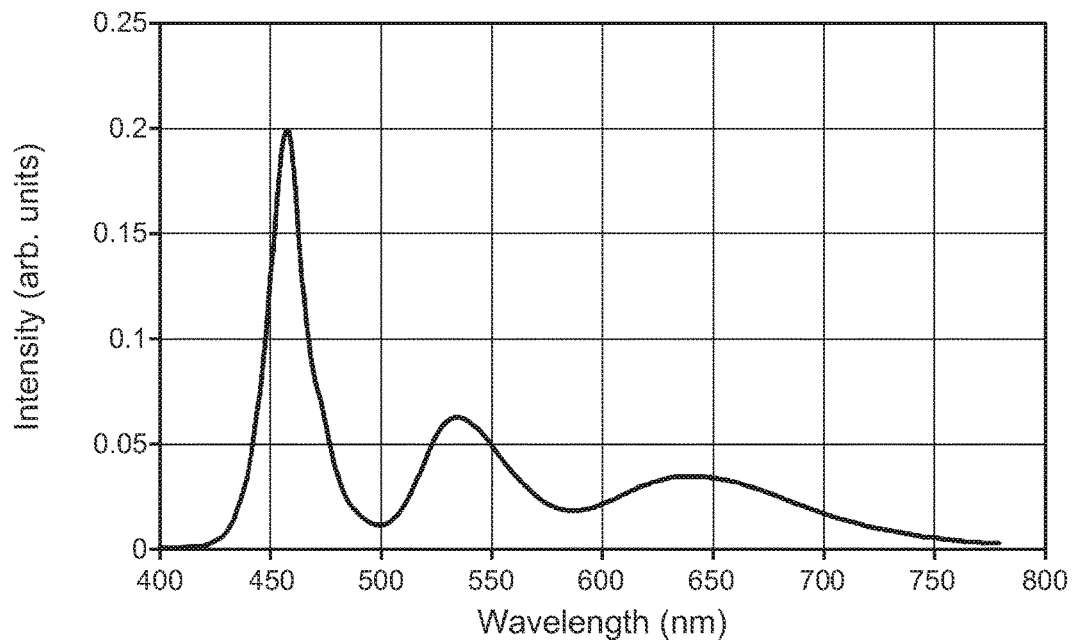
FIG. 12A shows the emission spectrum from an example phosphor-converted LED fabricated with a narrow green phosphor as described in example 6 below.
Figure 12B:
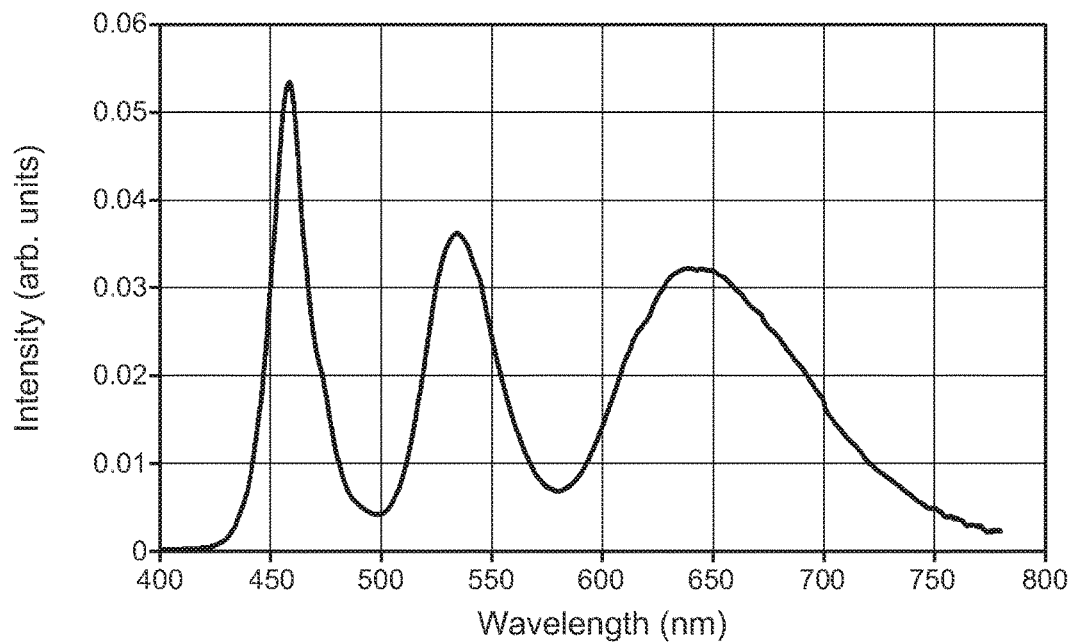
FIG. 12B shows the emission spectrum of the phosphor-converted LED of FIG. 12A as transmitted through the color filters of FIG. 1A.
Figure 12C:
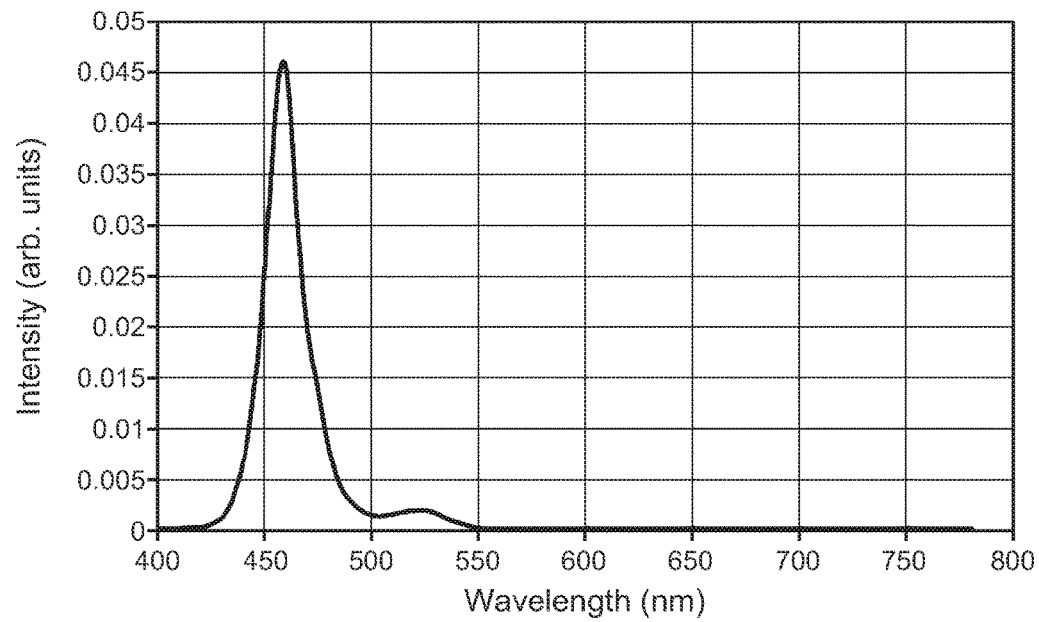
FIG. 12C shows the emission spectrum of the LED of FIG. 12A as transmitted through the blue color filter.
Figure 12D:
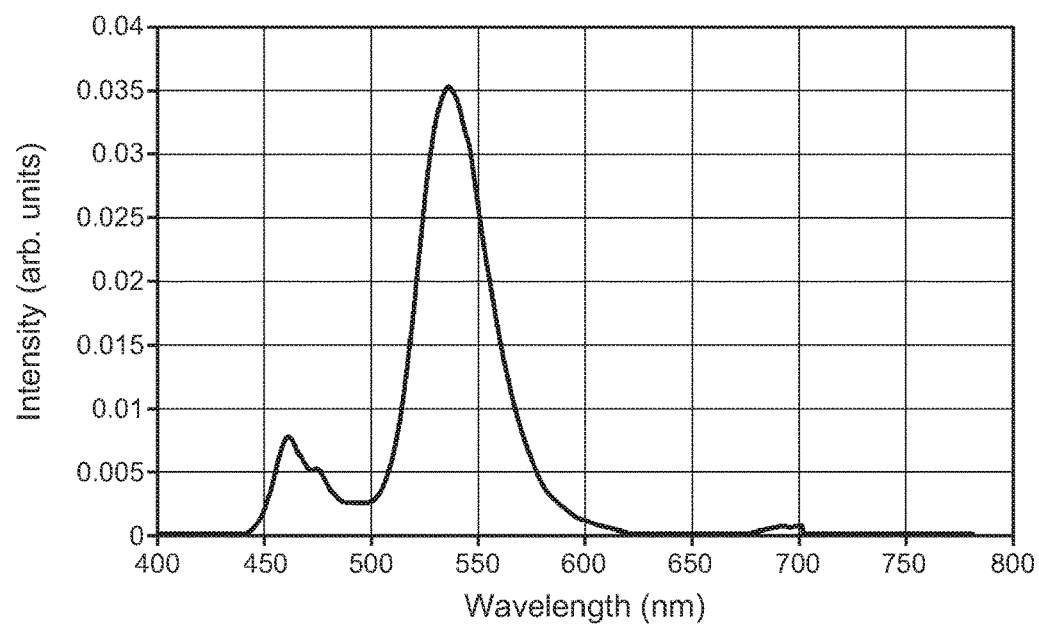
FIG. 12D shows the emission spectrum of the LED of FIG. 12A as transmitted through the green color filter.
Figure 12E:
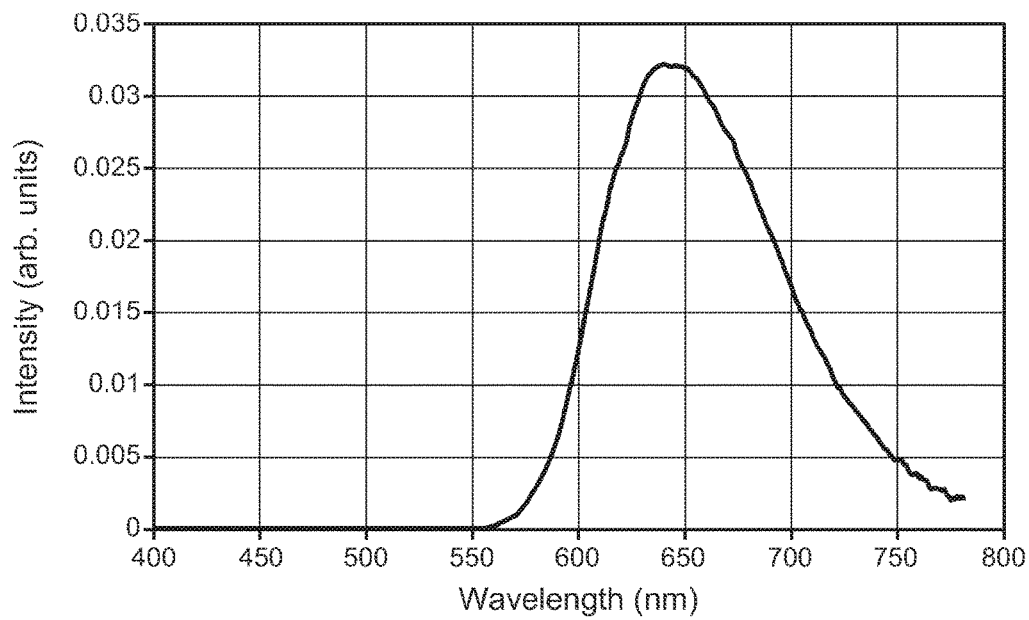
FIG. 12E shows the emission spectrum of the LED of FIG. 12A as transmitted through the red color filter.
Figure 12F:
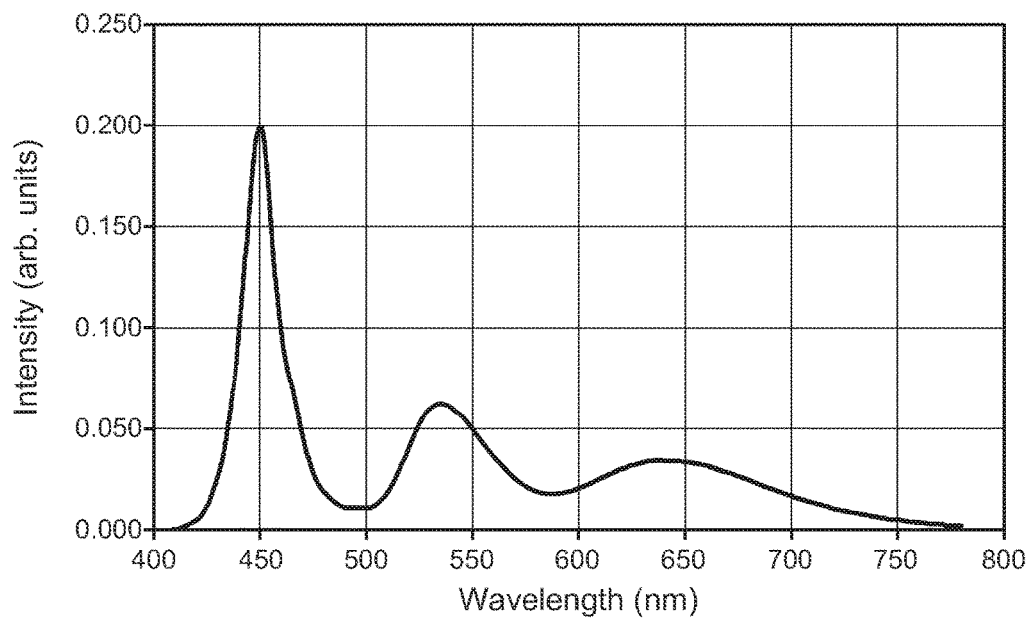
FIG. 12F shows a simulated emission spectrum using the same phosphor blend as that of the phosphor converted LED of FIG. 12A.
Figure 12G:
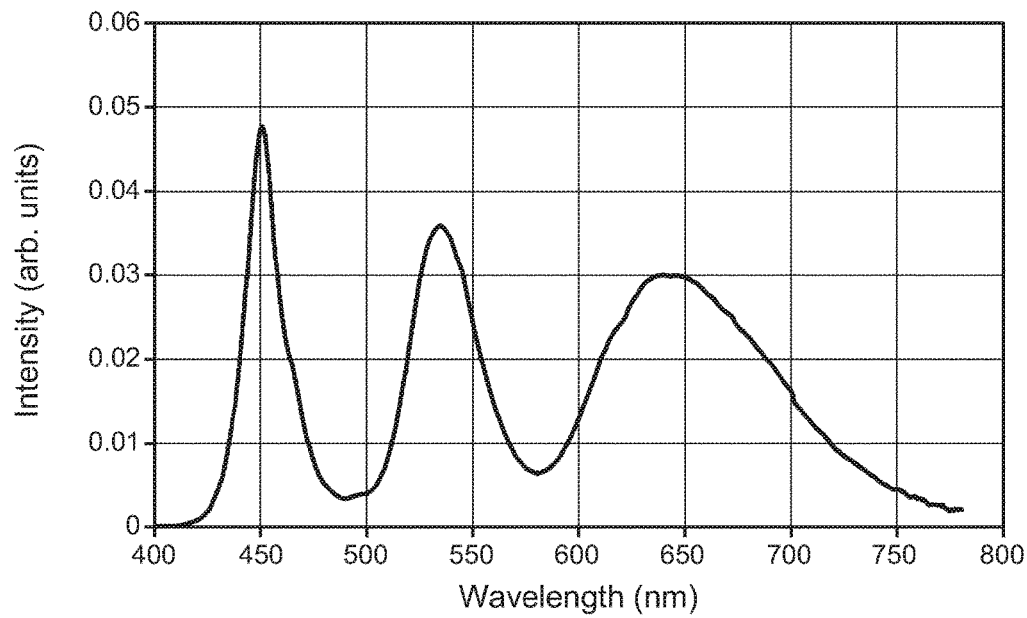
FIG. 12G shows the simulated emission spectrum of the LED of FIG. 12F as transmitted through the color filters of FIG. 1A.
Figure 12H:
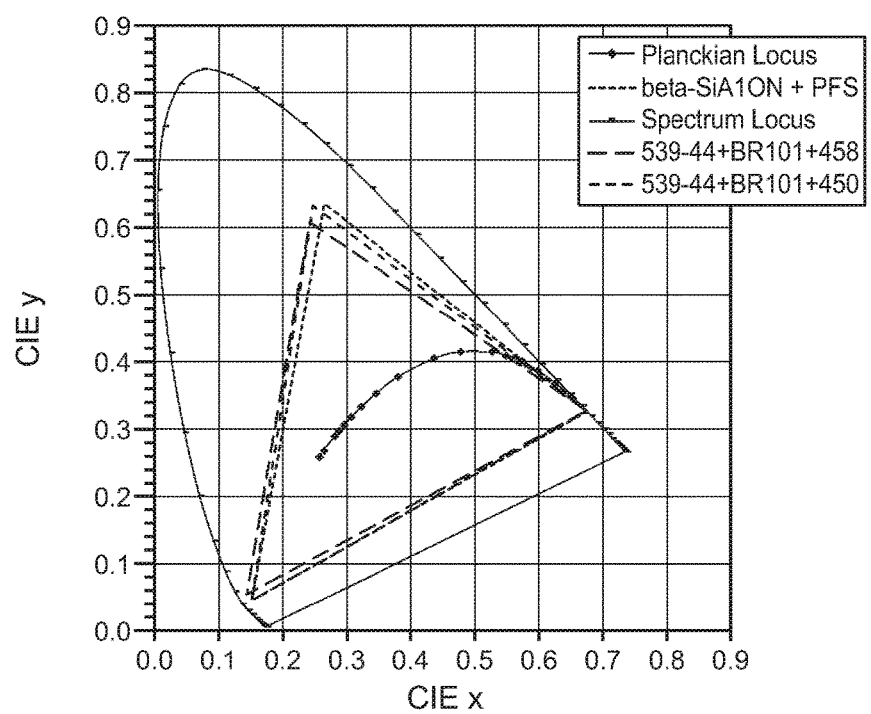
FIG. 12H shows a CIE 1931 x,y Chromaticity Diagram on which are plotted a simulated color gamut for the backlit LCD display of FIG. 6B, the color gamut of the backlit LCD display of FIG. 12B, and the simulated color gamut of the backlit LCD display of FIG. 12G.

LEDs for backlighting may also be fabricated utilizing broad red phosphors, such as BR-101/J sold by Mitsubishi Chemical. FIG. 12 A shows the emission spectrum from an example phosphor converted LED that was fabricated with a 458 nm blue LED, a green phosphor with a peak emission wavelength of 539 nm and a FWHM of 44 nm, and a BR-101/J red phosphor. The phosphor converted LED has color coordinates CIE x,y (0.2531, 0.2501). FIG. 12B shows the through-filter white spectrum tuned to CIE x,y (0.333, 0.333) by adjusting the individual filter thicknesses. FIG. 12C shows the blue subpixel, FIG. 12D shows the green subpixel, and FIG. 12E shows the red subpixel. FIG. 12F shows a simulated emission spectrum using the same phosphor blend with a 450 nm peak blue LED. The emission spectrum has color coordinates CIE x,y (0.2540, 0.2355). FIG. 12G shows the through-filter white spectrum tuned to CIE x,y (0.333, 0.333) for the simulated emission spectrum of FIG. 12F. FIG. 12H compares the gamuts of backlit LCD displays using the fabricated phosphor-converted LED and using the simulated phosphor-converted LED to the simulated gamut of a backlit LCD using a comparative beta-SiAlON LED. With the same wavelength blue LED, the combination of beta-SiAlON with PFS has a smaller gamut coverage than a narrower green phosphor coupled with the broad BR-101/J (62% to 66% vs Rec. 2020). Shifting the blue wavelength from 450 to 458 nm reduces the gamut coverage from 66% to 63%.

One such phosphor is $EuAl_{0.92}Ga_{1.38}S_{4.45}$ (phosphor example 5 in U.S. application Ser. No. 15/591,629), with a peak wavelength 539 nm and FWHM 44 nm. This phosphor was synthesized from Eu, $Al_2S_3$, $Ga_2S_3$, and S in a stoichiometric ratio, with an additional 0.25 sulfur per formula unit and 7.5 wt % $AlCl_3$. The mixture was ground in an argon filled glovebox and sealed in a fused silica tube. The mixture was heated to 400° C. (1 h), then 900° C. (6 h). The product was cooled to room temperature at 50° C./hr.

Tables 2, 3, and 4 below summarizes properties of the examples described above.

Figure 13:
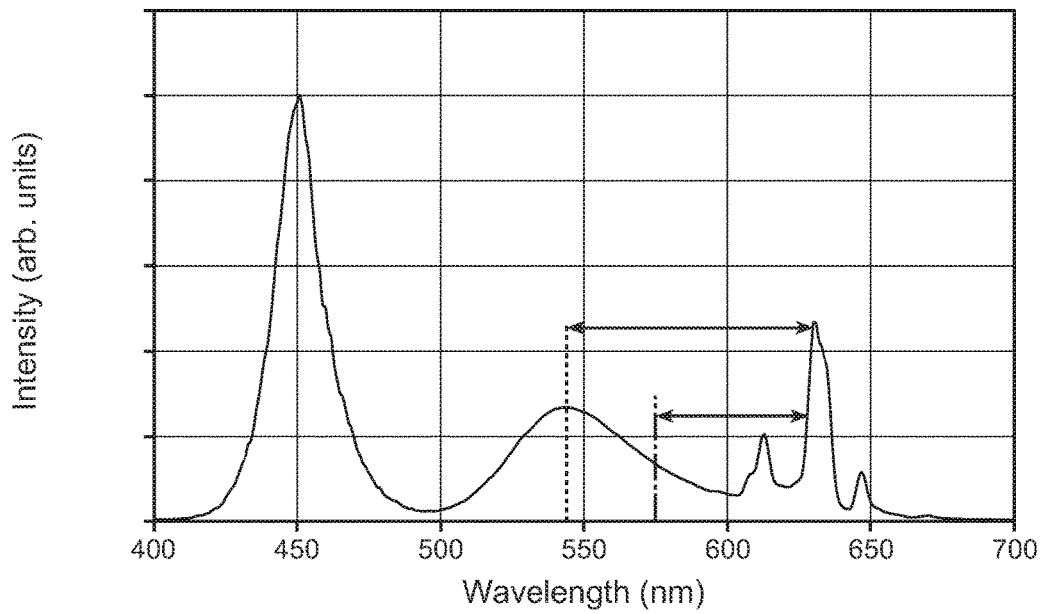
FIG. 13 shows a simulated spectrum for a phosphor converted LED comprising a blue LED, a beta-SiAlON green phosphor, and a red PFS phosphor, and indicates the distance between the emission peaks of the phosphors and the distance between the nearest half-heights of the phosphor peaks.
Figure 14:
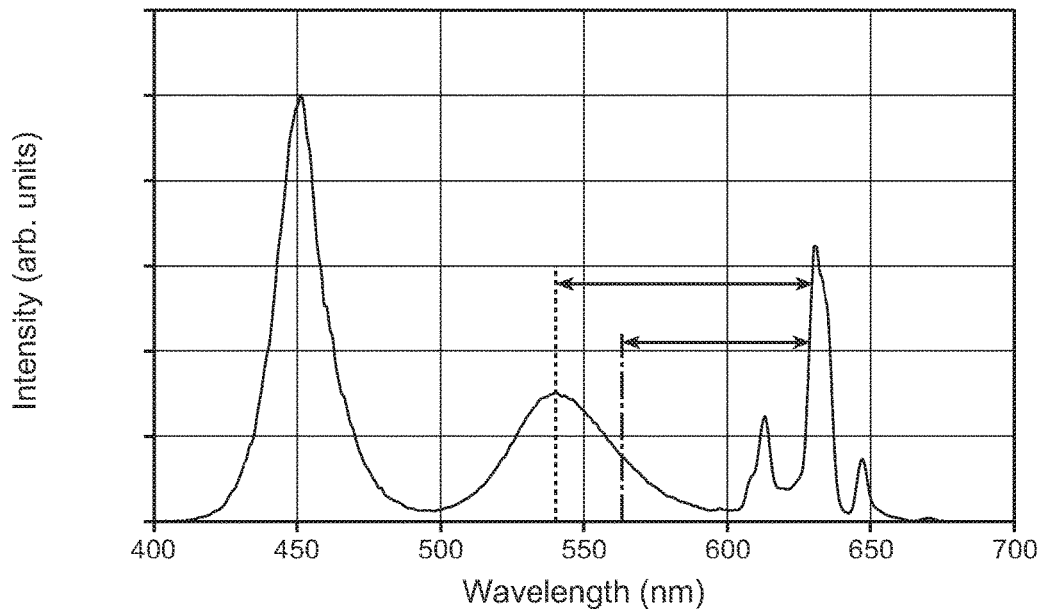
FIG. 14 shows a simulated spectrum for a phosphor-converted LED comprising a blue LED, a narrow green phosphor having its peak wavelength at 540 nm with FWHM of 40 nm), and a red PFS phosphor, and indicates the distance between the emission peaks of the phosphors and the distance between the nearest half-heights of the phosphor peaks.

To expand the gamut of a display, it is desirable for the three color peaks, blue, green, and red, to be as well resolved from each other as possible. One measure of the extent to which the green and red phosphor peaks are resolved from each other is to compare the difference between the peak wavelengths, and the difference between the wavelengths of the nearest edge at half heights of the two phosphors. For example, in the first comparative example utilizing beta-SiAlON and PFS, the green phosphor peak, $\lambda_G$, is at about 544 nm and the red phosphor peak, $\lambda_R$, is at 630 nm resulting in a difference of 86 nm (upper arrow, FIG. 13). The spectrum is at half its relative maximum for the green peak at 575 nm, $\lambda_{Ghalf}$. Similarly, the extremely narrow emission of the PFS is at half its relative maximum, $\lambda_{Rhalf}$, when the wavelength is 628 nm, resulting in a difference of 53 nm (lower arrow, FIG. 13). The ratio of the difference in nearest half heights to the difference in full heights is 0.62. Changing the green phosphor from the beta-SiAlON to one of the present invention with a peak wavelength of 540 nm, and a FWHM of 40 nm keeps roughly the same difference in full heights, 90 nm (upper arrow, FIG. 14), but increases the difference in nearest half-heights to 65 nm (lower arrow, FIG. 14) and increases the ratio of the difference in nearest half heights to the difference in full heights to 0.72.

Peak positions and ratios are tabulated in Table 3 for the examples given above. It appears that the higher the ratio, the less bleed through is likely between the green phosphor and red sub-pixel. With the PFS phosphor, standard phosphors such as a 524 nm peaked orthosilicate or 540 nm peaked beta-SiAlON give a ratio of about 0.6, while narrower phosphors disclosed here give a ratio greater than 0.7.

If these ratios are examined in the context of energy (electron volts) rather than wavelength (nm), the general trends hold true, although the ratios are about 0.03 to 0.04 lower. For example, in comparative example 1, the green phosphor peak, $E_G$, is at about 2.279 eV, the red peak, $E_R$, is at about 1.968 eV, and half heights, $E_{Ghalf}$ and $E_{Rhalf}$, are at 2.157 eV and 1.975 eV respectively, leading to a ratio of 0.58.

A typical backlight unit might be constructed from one or more (i.e., a plurality of) LEDs. The LEDs may be a top view type package, such as 1616, 2835, 3030, 3535, 3020, 5030, 7020 or other reasonable packages, where a relatively larger emitting surface area is desired, such as for televisions or free standing computer monitors. Such LEDs might be used in an area behind the emitting surface of the screen, or they might be optically coupled along the edge of a light guide, with the light guide spanning the area of the screen's emitting surface. Alternatively, where a relatively thinner display is desired, such as in a mobile phone, tablet display, or ultrathin laptop display, the LEDs may be of the side view type, which presents a very thin emitting surface, and a thinner overall profile for the device. The phosphors may be applied to the LEDS or, alternatively, one or both of the phosphors may be applied to the in-coupling or out-coupling side of the light guide or behind the color filters with respect to the viewer. The individual sub pixels may be controlled (opened or closed) by for example, use of a thin film transistor (TFT) layer and liquid crystal.

In addition to the uses described above, the phosphors of the current invention may be used to create saturated color LEDs. The very narrow FWHMs of these phosphor materials are on par with the typical PL emission of direct emitting LEDs, but are configured to utilize a more efficient blue LED pump source. For example, currently a very good direct emitting green LED has an external efficiency of about 20%. In contrast, the very best blue LEDs can operate at external efficiencies over 80%, while a mediocre blue LED may be about 55% external efficiency (and can be used to create a white LED at roughly 145 lm/W). Given the higher luminous efficacy of radiation (LER) for green, a direct emitter green (LED) can still be well over 100 lm/W even at the low 20% external efficiency. The boost in LER moving from blue (about 26 lm/$W_{rad}$) to green (>600 lm/$W_{rad}$) means that, even including the Stokes' loss incurred down-converting from blue to green, a fairly modest phosphor quantum efficiency of 50% results in a phosphor converted green that exhibits an external efficiency superior to that of a direct green LED, while still providing the narrow FWHM expected from a direct emitting LED. It is possible to combine a green LED made this way with a blue LED and a red LED to make a direct view display of wider gamut that is possible using LCD and color filter technology.

The phosphors used herein may exhibit instability with respect to air and moisture. Consequently, the phosphors are preferably coated with a protective barrier layer prior to use. This barrier layer prevents the phosphor from degrading over time and causing the color point of the LED to shift. This coating may be deposited by a sol-gel process, such as stirring the phosphor powder in a solution of an appropriate precursor, such as tetraethoxysilane, in a solvent, such as ethanol, and slowly adjusting the pH of the solution to be basic, for example with 5M $NH_4OH$ (aqueous), stirring for a period of time, optionally with heat, and then filtering or decanting the slurry to recover the solids. Alternatively, the phosphor may be coated by chemical vapor deposition in a fluidized bed reactor and treated with appropriate precursors, such as trimethyl aluminum, tetramethoxysilane, tetraethoxysilane, or titanium tetraisopropoxide, and water or ozone to form a metal oxide coating. The phosphor may also be coated by atomic layer deposition, for example, treating a powder bed with water vapor or ozone to form a hydroxide/oxide layer on the surface of phosphor, followed by treatment with a metal precursor such as trimethyl aluminum, alkoxysilanes, titanium alkoxides, or chlorosilanes, or titanium tetrachloride, or other reasonable metal sources, to form a layer of metal bonded to the oxide layer, followed by another treatment with water to form an oxide containing layer on top of the metal layer, and followed with a repeat treatment of metal precursor until a sufficient number of layers have been deposited, sometimes as few as 10 and sometimes as many as 200.

Optionally, after coating, the resultant phosphors may be annealed in air, or optionally under inert atmosphere at temperatures between 200 and 600 Celsius, or the phosphors may be coated additional times. It may also be advantageous to pre-coat the phosphor particles with a buffer layer before depositing the transparent metal oxide layer. This process forms a phosphor particle of composition $Eu_wCa_{1-w}(Al_{1-z}Ga_z)_xS_y$ (as described above) with an optional transparent buffer layer, and a transparent metal oxide coating comprising silicon oxide or aluminum oxide. The silicon oxide coating may have some percentage of hydroxide, and may also have some percentage of aluminum, titanium, yttrium, gallium, magnesium, zinc, or another metal which forms a transparent oxide. The aluminum oxide coating may have some percentage of hydroxide, and may also have some percentage of silicon, titanium, yttrium, gallium, magnesium, zinc, or another metal which forms a transparent oxide.

TABLE 1

CIE x, y gamut coordinates for red, green, and blue gamut vertices.

| | $x_R$ | $y_R$ | $y_G$ | $y_G$ | $x_B$ | $y_B$ |
|---|---|---|---|---|---|---|
| NTSC | 0.67 | 0.33 | 0.21 | 0.71 | 0.14 | 0.08 |
| sRGB (Rec. 709) | 0.640 | 0.330 | 0.300 | 0.600 | 0.150 | 0.060 |
| Adobe RGB | 0.640 | 0.330 | 0.210 | 0.710 | 0.150 | 0.060 |
| DCI-P3 | 0.680 | 0.320 | 0.265 | 0.690 | 0.150 | 0.060 |
| Rec. 2020 | 0.708 | 0.292 | 0.170 | 0.797 | 0.131 | 0.046 |

TABLE 2

Green phosphors and resultant gamut area.

| Example | Green phosphor attributes peak wavelength(FWHM) (with 450 peak blue LED and PFS) | Percent coverage of Rec.2020 gamut in CIE 1931 color space utilizing color filters in FIG. 1A |
|---|---|---|
| Comparative 1 | Beta-SiAlON 543 | 62% |
| Comparative 2 | Beta-SiAlON 528 | 70% |
| 1 | 540 nm (40 nm) | 68% |
| 2 | 535 nm (40 nm) | 71% |
| 3 | 529 nm (39 nm) | 74% |
| 4 | 523 nm (39 nm) | 75% |
| 5 | 520 nm (36 nm) | 76% |
| 6 | 539 nm (44 nm) * blue peak is 458, with BR-101/J | 63% |
|  | 539 nm (44 nm)* with BR-101/J | 66% |

TABLE 3

Phosphor peak position properties (wavelength in nm)

| Examples | $\lambda_G$ | $\lambda_{Ghalf}$ | $\lambda_{Rhalf}$ | $\lambda_R$ | $\lambda_R - \lambda_G$ | $\lambda_{Rhalf} - \lambda_{Ghalf}$ | ratio $\lambda_{Rhalf} - \lambda_{Ghalf})/(\lambda_R - \lambda_G)$ |
|---|---|---|---|---|---|---|---|
| Simulated LEDs |  |  |  |  |  |  |  |
| Comparative 1 | 544 | 575 | 628 | 630 | 86 | 53 | 0.62 |
| Comparative 2 | 528 | 557 | 628 | 630 | 102 | 71 | 0.70 |
| Comparative 3 | 526 | 566 | 628 | 630 | 104 | 62 | 0.61 |
| Example 1 | 540 | 563 | 628 | 630 | 90 | 65 | 0.72 |
| Example 2 | 535 | 558 | 628 | 630 | 95 | 70 | 0.75 |
| Example 3 | 529 | 552 | 628 | 630 | 101 | 76 | 0.76 |
| Example 4 | 523 | 545 | 628 | 630 | 107 | 83 | 0.79 |
| Example 5 | 520 | 540 | 628 | 630 | 110 | 88 | 0.81 |
| Fabricated LEDs |  |  |  |  |  |  |  |
| Comparative 3 | 524 | 565 | 628 | 631 | 107 | 63 | 0.59 |
| Example 4 LED 1 | 523 | 547 | 628 | 631 | 108 | 81 | 0.75 |
| Example 4 LED 2 | 523 | 547 | 628 | 631 | 108 | 81 | 0.75 |
| Example 6 | 534 | 564 | 587* | 637 | 103 | 23 | 0.22 |

*emission spectrum minimum between the green and red peaks is sightly greater than expected half height of red peak; spectrum minimum position used instead.

TABLE 4

Phosphor peak position properties (energy in eV)

| Examples | $E_G$ | $E_{Ghalf}$ | $E_{Rhalf}$ | $E_R$ | $E_G - E_R$ | $E_{Ghalf} - E_{Rhalf}$ | ratio $E_{Ghalf} - E_{Rhalf}/(E_G - E_R)$ |
|---|---|---|---|---|---|---|---|
| Simulated LEDs |  |  |  |  |  |  |  |
| Comparative 1 | 2.279 | 2.157 | 1.975 | 1.968 | 0.311 | 0.182 | 0.58 |
| Comparative 2 | 2.348 | 2.226 | 1.975 | 1.968 | 0.380 | 0.252 | 0.66 |
| Comparative 3 | 2.357 | 2.191 | 1.975 | 1.968 | 0.389 | 0.216 | 0.56 |
| Example 1 | 2.296 | 2.202 | 1.975 | 1.968 | 0.328 | 0.228 | 0.69 |
| Example 2 | 2.318 | 2.222 | 1.975 | 1.968 | 0.350 | 0.248 | 0.71 |
| Example 3 | 2.344 | 2.246 | 1.975 | 1.968 | 0.376 | 0.272 | 0.72 |
| Example 4 | 2.371 | 2.275 | 1.975 | 1.968 | 0.403 | 0.301 | 0.75 |
| Example 5 | 2.385 | 2.296 | 1.975 | 1.968 | 0.416 | 0.322 | 0.77 |
| Fabricated LEDs |  |  |  |  |  |  |  |
| Comparative 3 | 2.366 | 2.195 | 1.975 | 1.965 | 0.401 | 0.220 | 0.55 |
| Example 4 LED 1 | 2.371 | 2.267 | 1.975 | 1.965 | 0.406 | 0.292 | 0.72 |
| Example 4 LED 2 | 2.371 | 2.267 | 1.975 | 1.965 | 0.406 | 0.292 | 0.72 |
| Example 6 | 2.322 | 2.199 | 2.112* | 1.947 | 0.375 | 0.086 | 0.23 |

*emission spectrum minimum between the green and red peaks is slightly greater than expected half height of red peak; spectrum minimum position used instead.

Various embodiments are described in the following clauses.

Clause 1. A light emitting device comprising:

a light emitting solid state device emitting blue or violet light;

a first phosphor that absorbs blue or violet light emitted by the light emitting solid state device and in response emits green light in a spectral band having a peak at wavelength $\lambda_G$ and a height of one half its peak on a long wavelength edge of the band at wavelength $\lambda_{Ghalf}$; and a second phosphor that absorbs blue or violet light emitted by the light emitting solid state device and in response emits red light in a spectral band having a peak at wavelength $\lambda_R$ and a height of one half its peak on a short wavelength edge of the band at wavelength $\lambda_{Rhalf}$;

wherein the ratio $(\lambda_{Rhalf} - \lambda_{Ghalf})/(\lambda_R - \lambda_G)$ is greater than 0.70.

Clause 2. The light emitting device of clause 1, wherein the ratio $(\lambda_{Rhalf} - \lambda_{Ghalf})/(\lambda_R - \lambda_G)$ is greater than or equal to 0.75.

Clause 3. The light emitting device of clause 1, wherein the ratio $(\lambda_{Rhalf} - \lambda_{Ghalf})/(\lambda_R - \lambda_G)$ is greater than or equal to 0.80.

Clause 4. The light emitting device of any of clauses 1-3, wherein the peak of the green spectral band has a full width at half maximum of less than or equal to 45 nanometers.

Clause 5. The light emitting device of any of clauses 1-4, wherein:

the green phosphor is or comprises $Ca_{1-w}Eu_w(Al_{1-z}Ga_z)_xS_y$; and $2 \leq x \leq 4$, $4 \leq y \leq 7$, $0 \leq z \leq 1$, and $0 < w \leq 1$.

Clause 6. The light emitting device of any of clauses 1-5, wherein the red phosphor is or comprises a potassium fluorosilicate based phosphor.

Clause 7. The light emitting device of any of clauses 1-6, wherein the light emitting solid state device emits blue light.

Clause 8. The light emitting device of any of clauses 1-7, wherein the combined emission from the light emitting solid state device, the green phosphor, and the red phosphor has a color point on the CIE 1931 Chromaticity Diagram below the Planckian locus.

Clause 9. The light emitting device of any of clauses 1-8, wherein the first phosphor, the second phosphor, or the first phosphor and the second phosphor are disposed on the light emitting solid state device.

Clause 10. The light emitting device of any of clauses 1-8, wherein the first phosphor, the second phosphor, or the first phosphor and the second phosphor are spaced apart from the light emitting solid state device.

Clause 11. The light emitting device of any of clauses 1-10, wherein the light emitting solid state device is or comprises a light emitting diode.

Clause 12. The light emitting device of any of clauses 1-10, wherein the light emitting solid state device is or comprises a laser diode.

Clause 13. A light emitting device comprising:
a light emitting solid state device emitting blue light; and
a $Ca_{1-w}Eu_w(Al_{1-z}Ga_z)_xS_y$ phosphor that absorbs blue light emitted by the light emitting solid state device and in response emits green light;
wherein $2 \leq x \leq 4$, $4 \leq y \leq 7$, $0 \leq z \leq 1$, and $0 < w \leq 1$.

Clause 14. The light emitting device of clause 13, wherein the phosphor emits green light in a spectral band having a peak at a wavelength of 500 to 545 nanometers and a full width at half maximum of 25 to 50 nanometers.

This disclosure is illustrative and not limiting. Further modifications will be apparent to one skilled in the art in light of this disclosure and are intended to fall within the scope of the appended claims.

What is claimed is:

1. A light emitting device comprising:
   a light emitting solid state device emitting blue or violet light;
   a first phosphor that absorbs blue or violet light emitted by the light emitting solid state device and in response emits green light in a spectral band having a peak at wavelength $\lambda_G$ and a height of one half its peak on a long wavelength edge of the band at wavelength $\lambda_{Ghalf}$; and
   a second phosphor that absorbs blue or violet light emitted by the light emitting solid state device and in response emits red light in a spectral band having a peak at wavelength $\lambda_R$ and a height of one half its peak on a short wavelength edge of the band at wavelength $\lambda_{Rhalf}$;
   wherein the ratio $(\lambda_{Rhalf} - \lambda_{Ghalf})/(\lambda_R - \lambda_G)$ is greater than 0.70.

2. The light emitting device of claim 1, wherein the ratio $(\lambda_{Rhalf} - \lambda_{Ghalf})/(\lambda_R - \lambda_G)$ is greater than or equal to 0.75.

3. The light emitting device of claim 1, wherein the ratio $(\lambda_{Rhalf} - \lambda_{Ghalf})/(\lambda_R - \lambda_G)$ is greater than or equal to 0.80.

4. The light emitting device of claim 1, wherein the peak of the green spectral band has a full width at half maximum of less than or equal to 45 nanometers.

5. The light emitting device of claim 1, wherein:
   the green phosphor is or comprises $Ca_{1-w}Eu_w(Al_{1-z}Ga_z)_xS_y$; and
   $2 \leq x \leq 4$, $4 \leq y \leq 7$, $0 \leq z \leq 1$, and $0 < w \leq 1$.

6. The light emitting device of claim 1, wherein the red phosphor is or comprises a potassium fluorosilicate based phosphor.

7. The light emitting device of claim 1, wherein the light emitting solid state device emits blue light.

8. The light emitting device of claim 1, wherein the combined emission from the light emitting solid state device, the green phosphor, and the red phosphor has a color point on the CIE 1931 Chromaticity Diagram below the Planckian locus.

9. The light emitting device of claim 1, wherein the first phosphor, the second phosphor, or the first phosphor and the second phosphor are disposed on the light emitting solid state device.

10. The light emitting device of claim 1, wherein the first phosphor, the second phosphor, or the first phosphor and the second phosphor are spaced apart from the light emitting solid state device.

11. The light emitting device of claim 1, wherein the light emitting solid state device is or comprises a light emitting diode.

12. The light emitting device of claim 1, wherein the light emitting solid state device is or comprises a laser diode.

13. A light emitting device comprising:
   a light emitting solid state device emitting blue light; and
   a $Ca_{1-w}Eu_w(Al_{1-z}Ga_z)_xS_y$ phosphor that absorbs blue light emitted by the light emitting solid state device and in response emits green light;
   wherein $2 \leq x \leq 4$, $4 \leq y \leq 7$, $0 \leq z \leq 1$, and $0 < w \leq 1$.

14. The light emitting device of claim 13, wherein the phosphor emits green light in a spectral band having a peak at a wavelength of 500 to 545 nanometers and a full width at half maximum of 25 to 45 nanometers.

15. The light emitting device of claim 13, wherein the phosphor emits green light in a spectral band having a peak at a wavelength of 535 to 545 nanometers and a full width at half maximum between 25 and 50 nanometers.

* * * * *